United States Patent
Yu et al.

(10) Patent No.: US 11,227,837 B2
(45) Date of Patent: Jan. 18, 2022

(54) INTEGRATED CIRCUIT PACKAGE AND METHOD

(71) Applicant: Taiwan Semiconductor Manufacturing Company, Ltd., Hsinchu (TW)

(72) Inventors: Chen-Hua Yu, Hsinchu (TW); Jen-Fu Liu, Hsinchu (TW); Ming Hung Tseng, Toufen Township (TW); Tsung-Hsien Chiang, Hsinchu (TW); Yen-Liang Lin, Taichung (TW); Tzu-Sung Huang, Tainan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/868,111

(22) Filed: May 6, 2020

(65) Prior Publication Data

US 2021/0193582 A1    Jun. 24, 2021

Related U.S. Application Data

(60) Provisional application No. 62/952,856, filed on Dec. 23, 2019.

(51) Int. Cl.
*H01L 23/538* (2006.01)
*H01L 23/00* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............... H01L 23/5389; H01L 23/295; H01L 23/3128; H01L 23/5383; H01L 23/5386;
(Continued)

(56) References Cited

U.S. PATENT DOCUMENTS

| 8,361,842 B2 | 1/2013 | Yu et al. |
| 8,680,647 B2 | 3/2014 | Yu et al. |

(Continued)

FOREIGN PATENT DOCUMENTS

KR    101519307 B1    5/2015

*Primary Examiner* — Kyoung Lee
*Assistant Examiner* — Christina A Sylvia
(74) *Attorney, Agent, or Firm* — Slater Matsil, LLP

(57) ABSTRACT

In an embodiment, a structure includes: a first integrated circuit die including first die connectors; a first dielectric layer on the first die connectors; first conductive vias extending through the first dielectric layer, the first conductive vias connected to a first subset of the first die connectors; a second integrated circuit die bonded to a second subset of the first die connectors with first reflowable connectors; a first encapsulant surrounding the second integrated circuit die and the first conductive vias, the first encapsulant and the first integrated circuit die being laterally coterminous; second conductive vias adjacent the first integrated circuit die; a second encapsulant surrounding the second conductive vias, the first encapsulant, and the first integrated circuit die; and a first redistribution structure including first redistribution lines, the first redistribution lines connected to the first conductive vias and the second conductive vias.

20 Claims, 32 Drawing Sheets

(51) Int. Cl.
*H01L 23/29* (2006.01)
*H01L 23/31* (2006.01)
*H01L 21/48* (2006.01)
*H01L 21/56* (2006.01)
*H01L 21/683* (2006.01)
*H01L 25/00* (2006.01)
*H01L 25/10* (2006.01)

(52) U.S. Cl.
CPC .......... *H01L 21/565* (2013.01); *H01L 21/568* (2013.01); *H01L 21/6835* (2013.01); *H01L 23/295* (2013.01); *H01L 23/3128* (2013.01); *H01L 23/5383* (2013.01); *H01L 23/5386* (2013.01); *H01L 24/19* (2013.01); *H01L 24/20* (2013.01); *H01L 25/105* (2013.01); *H01L 25/50* (2013.01); *H01L 2221/68372* (2013.01); *H01L 2224/214* (2013.01); *H01L 2225/1035* (2013.01); *H01L 2225/1058* (2013.01); *H01L 2924/1434* (2013.01); *H01L 2924/19106* (2013.01)

(58) Field of Classification Search
CPC ..... H01L 24/19; H01L 24/20; H01L 21/4853; H01L 21/4857; H01L 21/565; H01L 21/568; H01L 21/6835; H01L 25/50; H01L 25/105; H01L 2924/19106; H01L 2225/1035; H01L 2225/1058; H01L 2224/214; H01L 2221/68372; H01L 2924/1434
See application file for complete search history.

(56) References Cited

U.S. PATENT DOCUMENTS

| | | | |
|---|---|---|---|
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 10,510,718 | B2 * | 12/2019 | Chen ............ H01L 24/19 |
| 2011/0291288 | A1 | 12/2011 | Wu et al. |
| 2013/0026468 | A1 | 1/2013 | Yoshimuta et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0307140 | A1* | 11/2013 | Huang .......... H01L 23/49811 257/737 |
| 2014/0077369 | A1 | 3/2014 | Liang et al. |
| 2014/0203429 | A1 | 7/2014 | Yu et al. |
| 2014/0210101 | A1* | 7/2014 | Lin .............. H01L 24/97 257/774 |
| 2014/0217604 | A1* | 8/2014 | Chou ........... H01L 21/486 257/774 |
| 2014/0225222 | A1 | 8/2014 | Yu et al. |
| 2014/0252646 | A1 | 9/2014 | Hung et al. |
| 2014/0264930 | A1 | 9/2014 | Yu et al. |
| 2016/0049385 | A1 | 2/2016 | Yu et al. |
| 2017/0221820 | A1* | 8/2017 | Yu .............. H01L 21/6835 |
| 2018/0315674 | A1* | 11/2018 | Chen ........... H01L 23/3128 |
| 2019/0214347 | A1 | 7/2019 | Huang et al. |
| 2019/0244947 | A1 | 8/2019 | Yu et al. |

* cited by examiner

INTEGRATED CIRCUIT PACKAGE AND METHOD

PRIORITY CLAIM AND CROSS-REFERENCE

This application claims the benefit of U.S. Provisional Application No. 62/952,856 filed on Dec. 23, 2019, which application is hereby incorporated herein by reference.

BACKGROUND

As semiconductor technologies continue to evolve, integrated circuit dies are becoming increasingly smaller. Further, more functions are being integrated into the dies. Accordingly, the numbers of input/output (I/O) pads needed by dies has increased while the area available for the I/O pads has decreased. The density of the I/O pads has risen quickly over time, increasing the difficulty of die packaging. Some applications call for greater parallel processing capabilities of integrated circuit dies. Packaging technologies may be used to integrate of multiple dies, allowing a greater degree of parallel processing capabilities.

In some packaging technologies, integrated circuit dies are singulated from wafers before they are packaged. An advantageous feature of this packaging technology is the possibility of forming fan-out packages, which allow the I/O pads on a die to be redistributed to a greater area. The number of I/O pads on the surfaces of the dies may thus be increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
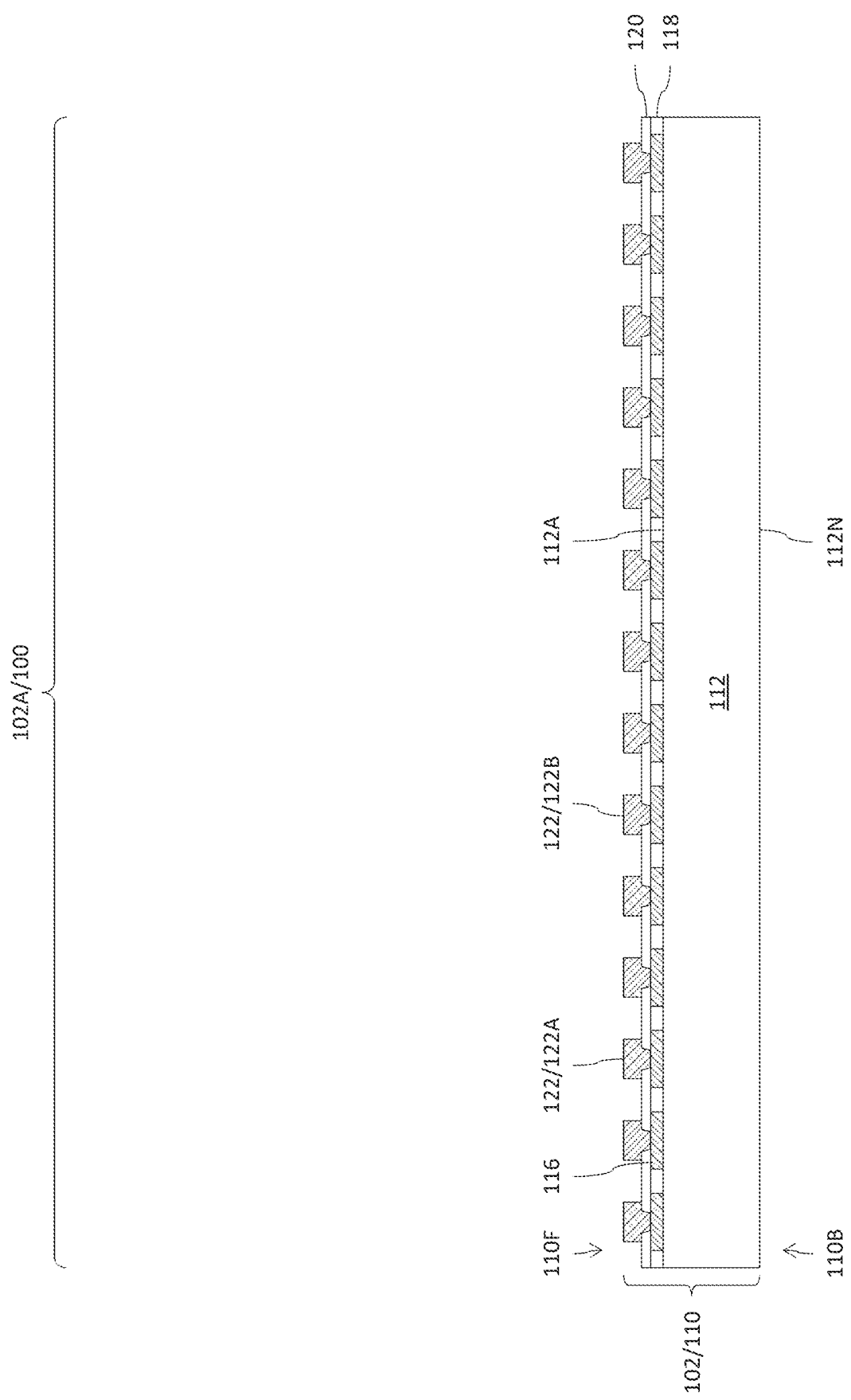
FIGS. 1, 2, 3, 4, 5, 6, 7, and 8 are cross-sectional views of intermediate steps during a process for forming a die stack, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a die stack is formed including multiple integrated circuit dies. The die stack is formed by stacking dies in a face-to-face or a back-to-face manner. The integrated circuit dies of the die stack can be bonded with reflowable connectors or an adhesive. Such bonding techniques may not allow for as fine of a die connector pitch or as large of an input/output (I/O) connector count as other bonding techniques, such as hybrid bonding, however, such bonding techniques allows the bonding to be performed at a lower cost. Forming the die stack at a lower cost may be particularly desirable when the die stack is a low-performance device. The resulting die stack can be, e.g., a system-on-integrated circuit (SoIC) device. Once formed, the SoIC device can be included in an integrated circuit package.

FIGS. 1, 2, 3, 4, 5, 6, 7, and 8 are cross-sectional views of intermediate steps during a process for forming a die stack 100, in accordance with some embodiments. The die stack 100 is formed by stacking integrated circuit dies on a wafer 102. Stacking of integrated circuit dies in one device region 102A of the wafer 102 is illustrated, but it should be appreciated that the wafer 102 may have any number of device regions, and integrated circuit dies may be stacked to form a die stack in each device region. The integrated circuit dies of the die stack 100 are directly bonded in a face-to-face manner with reflowable connectors.

In FIG. 1, the wafer 102 is formed or obtained. The wafer 102 comprises a first integrated circuit die 110 in the device region 102A. The first integrated circuit die 110 will be singulated in subsequent processing to be included in the die stack 100. The first integrated circuit die 110 can be any acceptable processor or logic device, such as a central processing unit (CPU), graphics processing unit (GPU), arithmetic logic unit (ALU), system-on-a-chip (SoC), application processor (AP), image signal processor (ISP), digital signal processing (DSP), field programmable gate array (FPGA), microcontroller, artificial intelligence (AI) accelerator, or the like.

The first integrated circuit die 110 is processed according to applicable manufacturing processes to form integrated circuits. For example, the first integrated circuit die 110 includes a semiconductor substrate 112, such as silicon, doped or undoped, or an active layer of a semiconductor-on-insulator (SOI) substrate. The semiconductor substrate 112 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 112 has an active surface 112A and an inactive surface 112N.

Devices are formed at the active surface 112A of the semiconductor substrate 112. The devices can be active devices (e.g., transistors, diodes, etc.), capacitors, resistors, etc. The inactive surface 112N is at the back side 110B of the first integrated circuit die 110, and may be free from devices. An interconnect structure is formed at the active surface 112A of the semiconductor substrate 112. The interconnect structure interconnects the devices at the active surface 112A of the semiconductor substrate 112 to form an integrated circuit. The interconnect structure may be formed of, for example, metallization patterns in dielectric layers, and may be formed by a damascene process, such as a single damascene process, a dual damascene process, or the like. The metallization patterns include metal lines and vias formed in one or more dielectric layers. The metallization patterns of the interconnect structure are electrically coupled to the devices at the active surface 112A of the semiconductor substrate 112.

Contact pads 116 are also formed over the active surface 112A of the semiconductor substrate 112. The contact pads 116 may be aluminum pads, copper pads, or the like, and can be formed by, for example, plating, deposition, or the like. A dielectric layer 118 is formed around the contact pads 116. The dielectric layer 118 may be a polymer such as polybenzoxazole (PBO), polyimide, a benzocyclobutene (BCB) based polymer, or the like; a nitride such as silicon nitride or the like; an oxide such as silicon oxide, PSG, BSG, BPSG, or the like; the like, or a combination thereof. The dielectric layer 118 may be formed, for example, by spin coating, lamination, deposition, or the like. The contact pads 116 and dielectric layer 118 can be part of an interconnect structure, such as part of a topmost layer of the interconnect structure.

One or more passivation layer(s) 120 are formed on the contact pads 116 and the semiconductor substrate 112. The passivation layer(s) 120 may be formed of one or more suitable dielectric materials such as silicon oxide, silicon nitride, low-k dielectrics such as carbon doped oxides, extremely low-k dielectrics such as porous carbon doped silicon dioxide, a polymer such as polyimide, solder resist, PBO, a BCB-based polymer, molding compound, the like, or a combination thereof. The passivation layer(s) 120 may be formed by spin coating, lamination, deposition, the like, or a combination thereof.

Die connectors 122 are formed on respective ones of the contact pads 116, and are exposed at a front side 110F of the first integrated circuit die 110. The die connectors 122 may be conductive pillars, bumps, through vias, or the like, and may be formed of a metal such as copper. The die connectors 122 are connected (e.g., physically and electrically coupled) to respective ones of the contact pads 116, and are electrically coupled to the respective integrated circuits of the first integrated circuit die 110. As an example to form the die connectors 122, openings are formed in the passivation layer(s) 120, and a seed layer is formed along the passivation layer(s) 120 and in the openings through the passivation layer(s) 120. The openings may be formed by acceptable photolithography and etching techniques. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed by deposition, such as PVD or the like. A photoresist is formed and patterned on the seed layer. The photoresist may be formed by spin coating or the like, and can be exposed to light for patterning. The pattern of the photoresist corresponds to the die connectors 122. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, such as copper, nickel, titanium, tungsten, aluminum, or the like. In some embodiments, the conductive material is a composite layer comprising a plurality of sub-layers formed of different materials. For example, the conductive material can include a nickel layer between two copper layers. The photoresist can be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the die connectors 122.

Circuit probe (CP) testing is then performed on the first integrated circuit die 110 to ascertain whether the first integrated circuit die 110 is a known good die (KGD). The first integrated circuit die 110 is tested by use of a probe. The probe is connected to the die connectors 122 by, e.g., reflowable connectors. Only integrated circuit dies which are KGDs undergo subsequent processing and packaging, and integrated circuit dies which fail the CP testing are not packaged. The testing may include testing of the functionality of the first integrated circuit die 110, or may include testing for known open or short circuits that may be expected based on the design of the first integrated circuit die 110. After testing is complete, the probe is removed and any excess reflowable material on the die connectors 122 can be removed by, e.g., an etching process, a chemical-mechanical polish (CMP), a grinding process, or the like.

Figure 2:
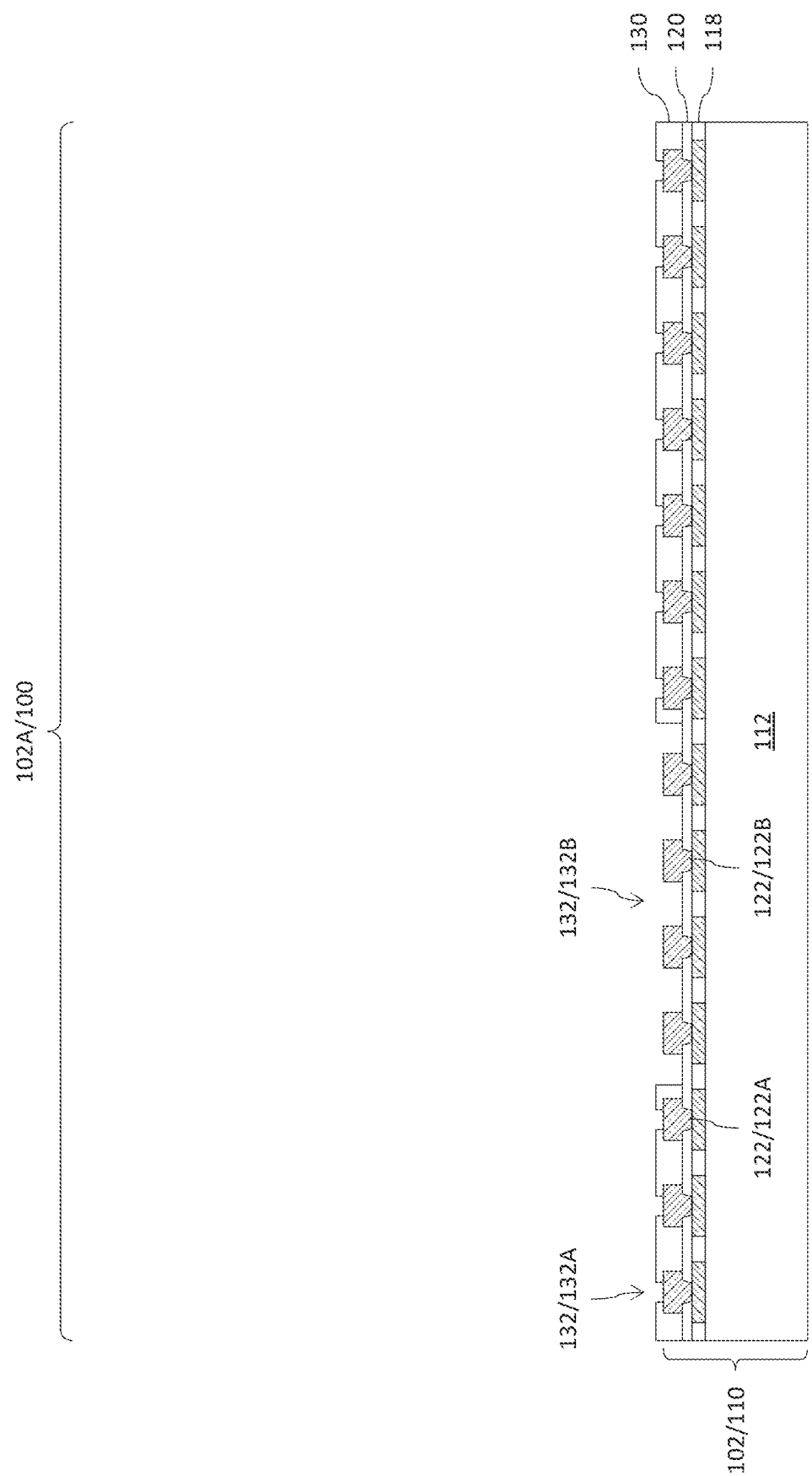

In FIG. 2, a dielectric layer 130 is formed on the wafer 102, such as on the die connectors 122 and passivation layer(s) 120. In some embodiments, the dielectric layer 130 is formed of a polymer, such as polyimide, PBO, a BCB-based polymer, or the like. In other embodiments, the dielectric layer 130 is formed of an oxide such as silicon oxide, PSG, BSG, BPSG, or the like; a nitride such as silicon nitride; or the like. The dielectric layer 130 may be formed by any acceptable deposition process, such as spin coating, CVD, laminating, the like, or a combination thereof.

The dielectric layer 130 is then patterned to form openings 132 exposing portions of the die connectors 122. The patterning may be formed by an acceptable process, such as by exposing the dielectric layer 130 to light when the dielectric layer 130 is a photo-sensitive material or by etching using, for example, an anisotropic etch. If the dielectric layer 130 is a photo-sensitive material, the dielectric layer 130 can be developed after the exposure.

A first subset of the die connectors 122A are exposed by a subset of the openings 132A. Each of the openings 132A exposes a respective one of the die connectors 122A. As discussed further below, a conductive via will be formed in each of the openings 132A and connected to a respective one of the die connectors 122A. A second subset of the die connectors 122B are exposed by an opening 132B. Specifically, the opening 132B exposes multiple ones of the die connectors 122B. As discussed further below, an integrated circuit die will be placed in the opening 132B and connected to the die connectors 122B. The opening 132B is wider than each of the openings 132A. For example, the openings 132A can each have a width in the range of about 10 μm to about 15 μm, and the opening 132B can have a width in the range of about 3000 μm to about 6000 μm. A wider opening 132B helps accommodate an integrated circuit die.

Figure 3:
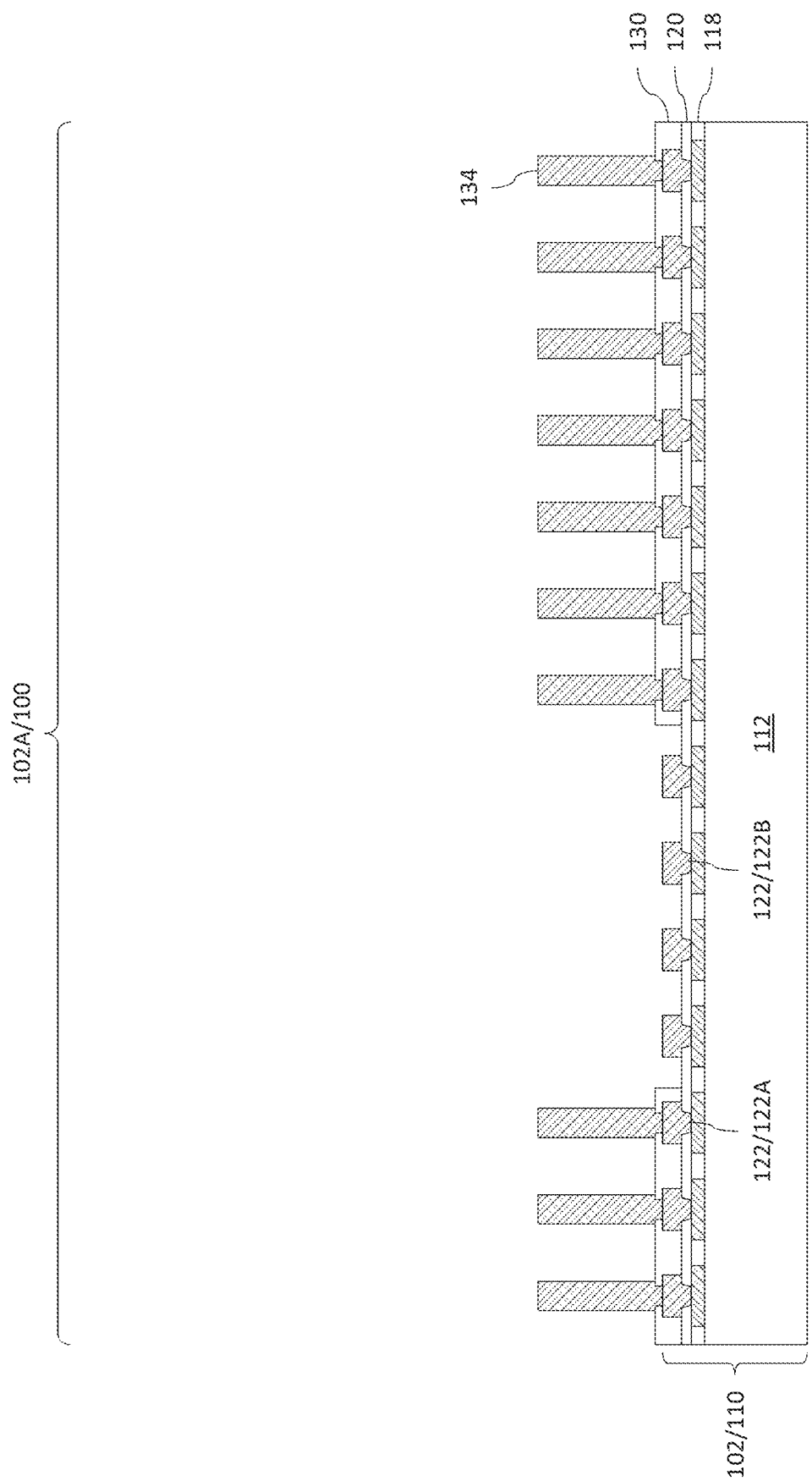

In FIG. 3, conductive vias 134 are formed in the openings 132A, extending through the dielectric layer 130 and away from the wafer 102. The conductive vias 134 are connected to the die connectors 122A. As an example to form the conductive vias 134, a seed layer is formed over the dielectric layer 130 and portions of the die connectors 122A exposed by the openings 132A. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive vias 134. The conductive vias 134 can be formed to a pitch, for example, in the range of about 40 μm to about 80 μm.

Figure 4:
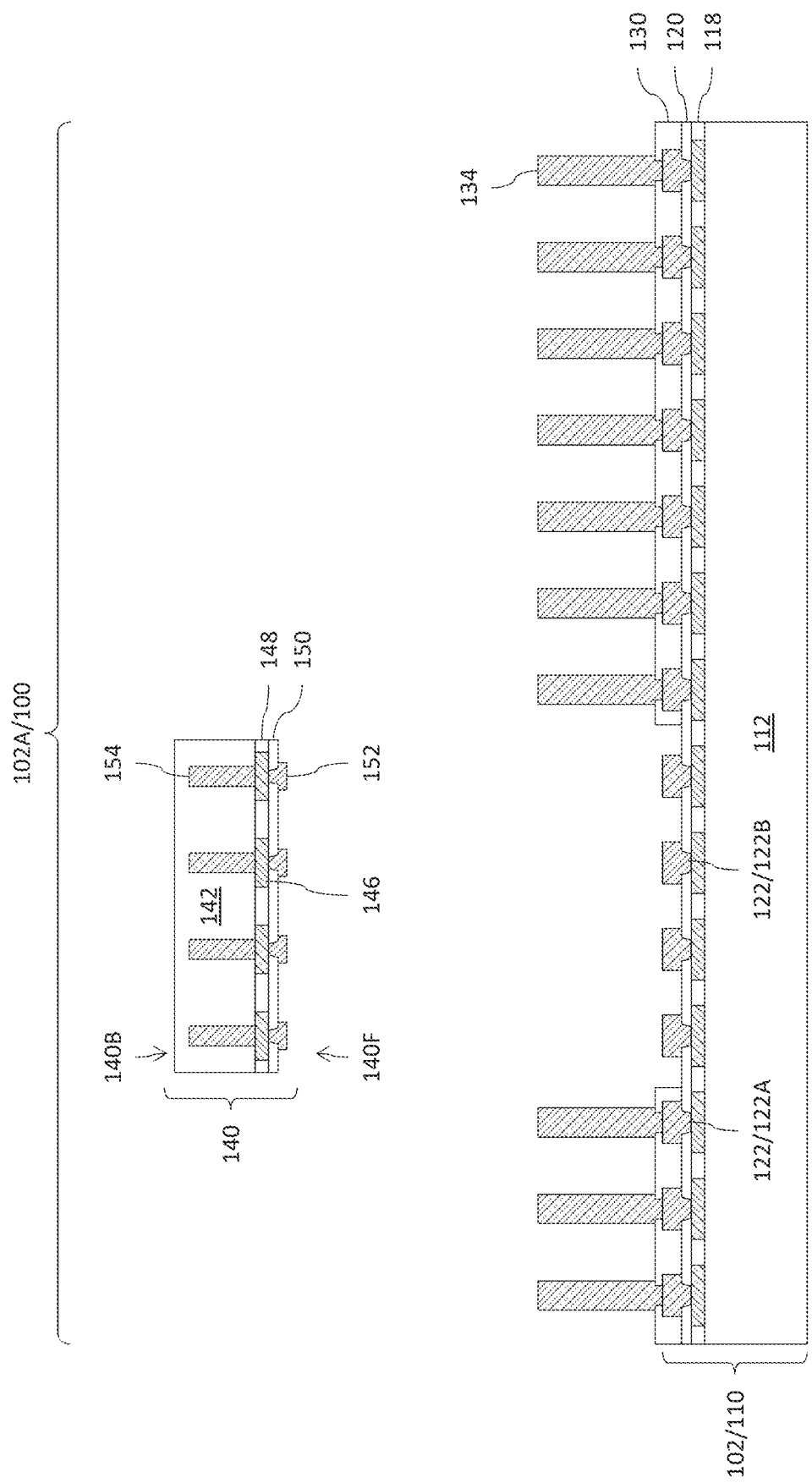

In FIG. 4, a second integrated circuit die 140 is formed or obtained. The second integrated circuit die 140 has several possible functions, and has a different function than the first integrated circuit die 110. In some embodiments, the second integrated circuit die 140 is an analog device die, such as a power gating die, a power management integrated circuit (PMIC), or the like. In some embodiments, the second integrated circuit die 140 is an input/output (I/O) die, such as an interface die, a through-substrate vias (TSV) die, or the like. In some embodiments, the second integrated circuit die 140 is a memory die, such as a dynamic random access memory (DRAM) die, static random access memory (SRAM) die, resistive random-access memory (RRAM) die, magnetoresistive random-access memory (MRAM) die, phase-change random-access memory (PCRAM) die, or the like. In some embodiments, the second integrated circuit die 140 is another processor or logic device, such as a GPU, a DSP, or the like.

The second integrated circuit die 140 may be formed in a wafer, which may include different device regions that are singulated in subsequent steps to form a plurality of integrated circuit dies. When the second integrated circuit die 140 includes active devices, they can be of a larger technology node than the first integrated circuit die 110. The second integrated circuit die 140 is processed according to applicable manufacturing processes to form integrated circuits. For example, the second integrated circuit die 140 includes a semiconductor substrate 142, contact pads 146, a dielectric layer 148, one or more passivation layer(s) 150, and die connectors 152 which, respectively, can be similar to the semiconductor substrate 112, the contact pads 116, the dielectric layer 118, the passivation layer(s) 120, and the die connectors 122 of the first integrated circuit die 110. The die connectors 152 are exposed at a front side 140F of the second integrated circuit die 140. The semiconductor substrate 142, the dielectric layer 148, and the passivation layer(s) 150 are laterally coterminous after singulation of the second integrated circuit die 140. The second integrated circuit die 140 further includes conductive vias 154, which are formed extending into the semiconductor substrate 142. The conductive vias 154 are electrically coupled to the devices of the semiconductor substrate 142, such as through metallization patterns of an interconnect structure.

As an example to form the conductive vias 154, recesses can be formed in the semiconductor substrate 142 by, for example, etching, milling, laser techniques, a combination thereof, and/or the like. A thin dielectric material may be formed in the recesses, such as by using an oxidation technique. A thin barrier layer may be conformally deposited in the openings, such as by CVD, atomic layer deposition (ALD), physical vapor deposition (PVD), thermal oxidation, a combination thereof, and/or the like. The barrier layer may be formed from an oxide, a nitride, or an oxynitride, such as titanium nitride, titanium oxynitride, tantalum nitride, tantalum oxynitride, tungsten nitride, a combination thereof, and/or the like. A conductive material may be deposited over the barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from the surface of the semiconductor substrate 142 by, for example, a CMP. Remaining portions of the barrier layer and conductive material form the conductive vias 154.

In accordance with some embodiments, the conductive vias 154 are not yet exposed at a back side 140B of the second integrated circuit die 140. Rather, the conductive vias 154 are buried in the semiconductor substrate 142. As discussed further below, the conductive vias 154 will be exposed at the back side 140B of the second integrated circuit die 140 through an exposure process in subsequent processing. After exposure, the conductive vias 154 can be referred to as TSVs.

Figure 5:
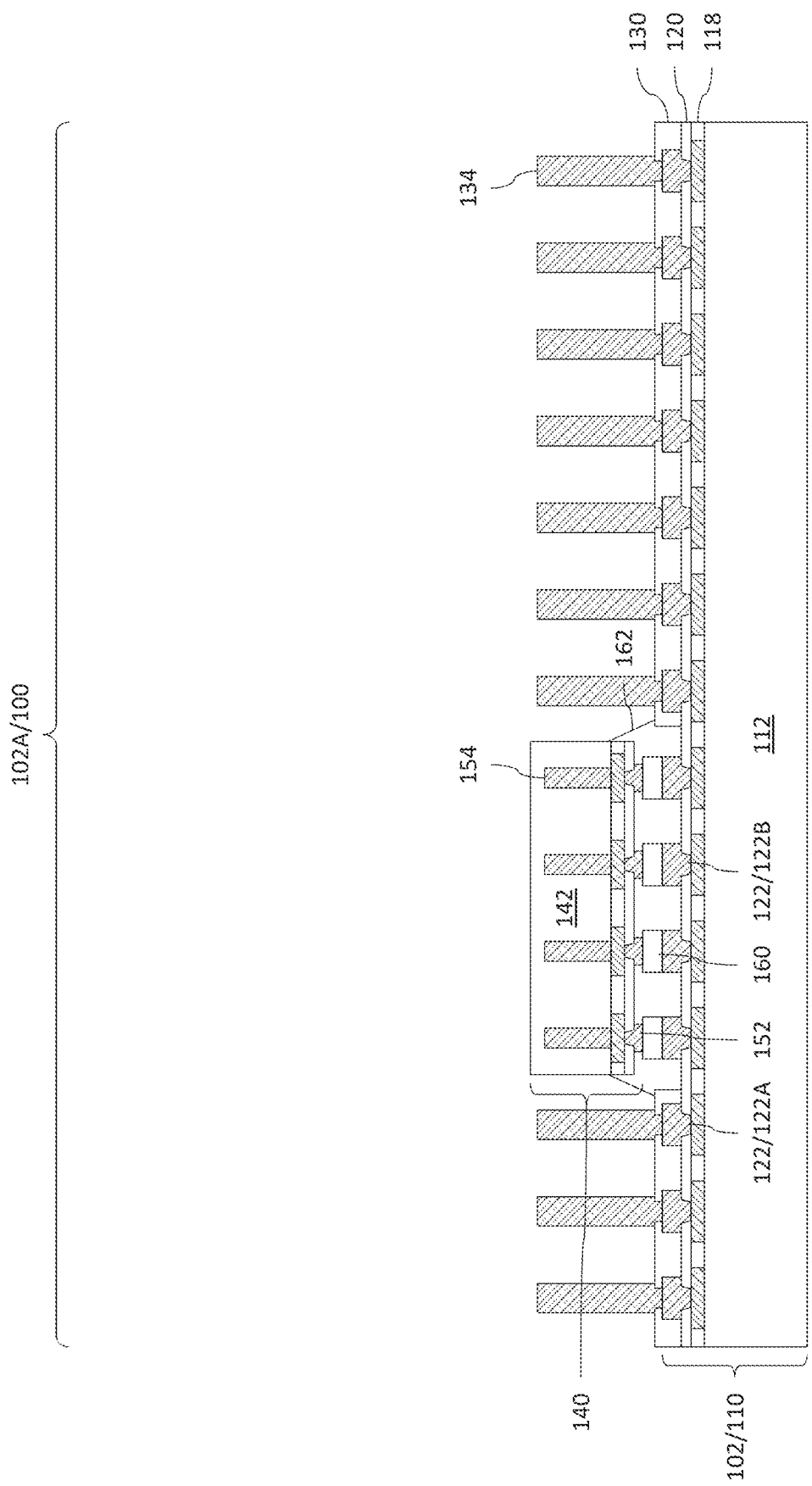

In FIG. 5, the second integrated circuit die 140 is placed in the opening 132B and bonded to the first integrated circuit die 110 (e.g., the wafer 102). The first integrated circuit die 110 and the second integrated circuit die 140 are directly bonded in a face-to-face manner with reflowable connectors 160, such that the front side 110F of the first integrated circuit die 110 is bonded to the front side 140F of the second integrated circuit die 140. The reflowable connectors 160 may be ball grid array (BGA) connectors, solder balls, or the like. The reflowable connectors 160 may be formed of a metal or metal alloy, such as solder, copper, aluminum, gold, nickel, silver, palladium, tin, the like, or a combination thereof. In some embodiments, the reflowable connectors 160 are formed by initially forming a layer of solder through methods such as evaporation, electroplating, printing, solder transfer, ball placement, or the like. The reflowable connectors 160 can be initially formed on the die connectors 122B or on the die connectors 152. Once a layer of solder has been formed, a reflow may be performed in order to shape the material into the desired bump shapes. The first integrated circuit die 110 and the second integrated circuit die 140 are bonded by contacting the reflowable connectors 160 to the die connectors 122B and the die connectors 152, and reflowing the reflowable connectors 160. After the reflowing the die connectors 122B are connected to the die connectors 152. Bonding the first integrated circuit die 110 and the second integrated circuit die 140 with the reflowable connectors 160 allows the bonding to be performed at a lower cost than other bonding techniques, such as hybrid bonding.

The reflowable connectors 160 may have flux (not illustrated) formed thereon before they are reflowed. In some embodiments, the flux is removed with a flux cleaning process after the reflowable connectors 160 are reflowed. An underfill 162 is optionally formed between the first integrated circuit die 110 and the second integrated circuit die 140, surrounding the reflowable connectors 160. The underfill 162 may be formed by a capillary flow process after the first integrated circuit die 110 and the second integrated circuit die 140 are bonded, or may be formed by a suitable deposition method before the first integrated circuit die 110 and the second integrated circuit die 140 are bonded. The underfill 162 fills the opening 132B, can extend along sidewalls of the second integrated circuit die 140, and can extend along a portion of the top surface of the dielectric layer 130.

Figure 6:
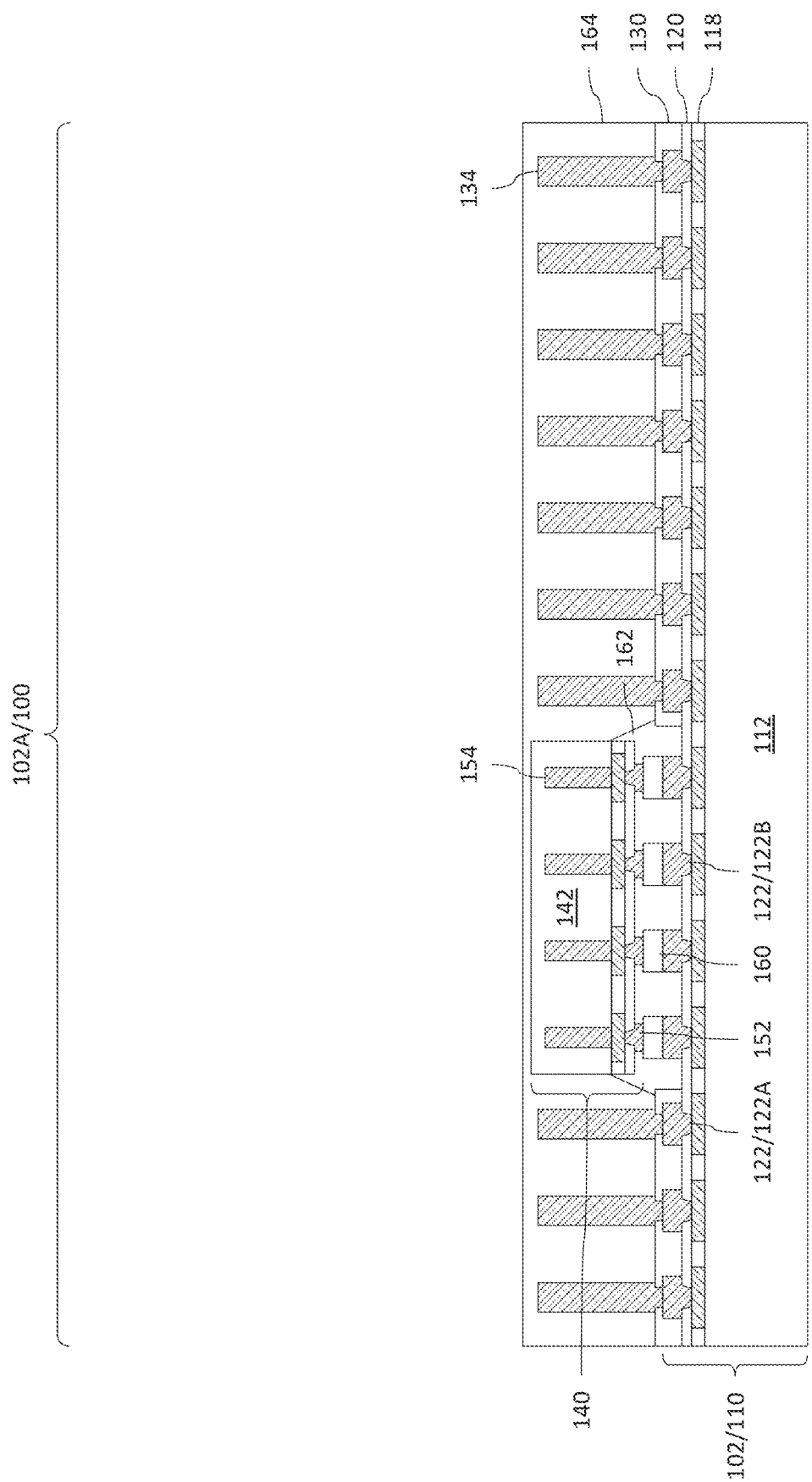

In FIG. 6, an encapsulant 164 is formed on and around the conductive vias 134 and the second integrated circuit die 140. After formation, the encapsulant 164 encapsulates the conductive vias 134 and the second integrated circuit die 140. The encapsulant 164 may be a molding compound, epoxy, or the like. The encapsulant 164 may be applied by compression molding, transfer molding, or the like, and may be formed over the wafer 102 such that the conductive vias 134 and/or the second integrated circuit die 140 are buried or covered. The encapsulant 164 may be applied in liquid or semi-liquid form and then subsequently cured. As noted above, the underfill 162 is optional; when the underfill 162 is omitted, the encapsulant 164 can surround and physically contact sidewalls of each of the die connectors 122B, the die connectors 152, and the reflowable connectors 160. Further, when the underfill 162 is omitted, the encapsulant 164 can extend through the dielectric layer 130.

Figure 7:
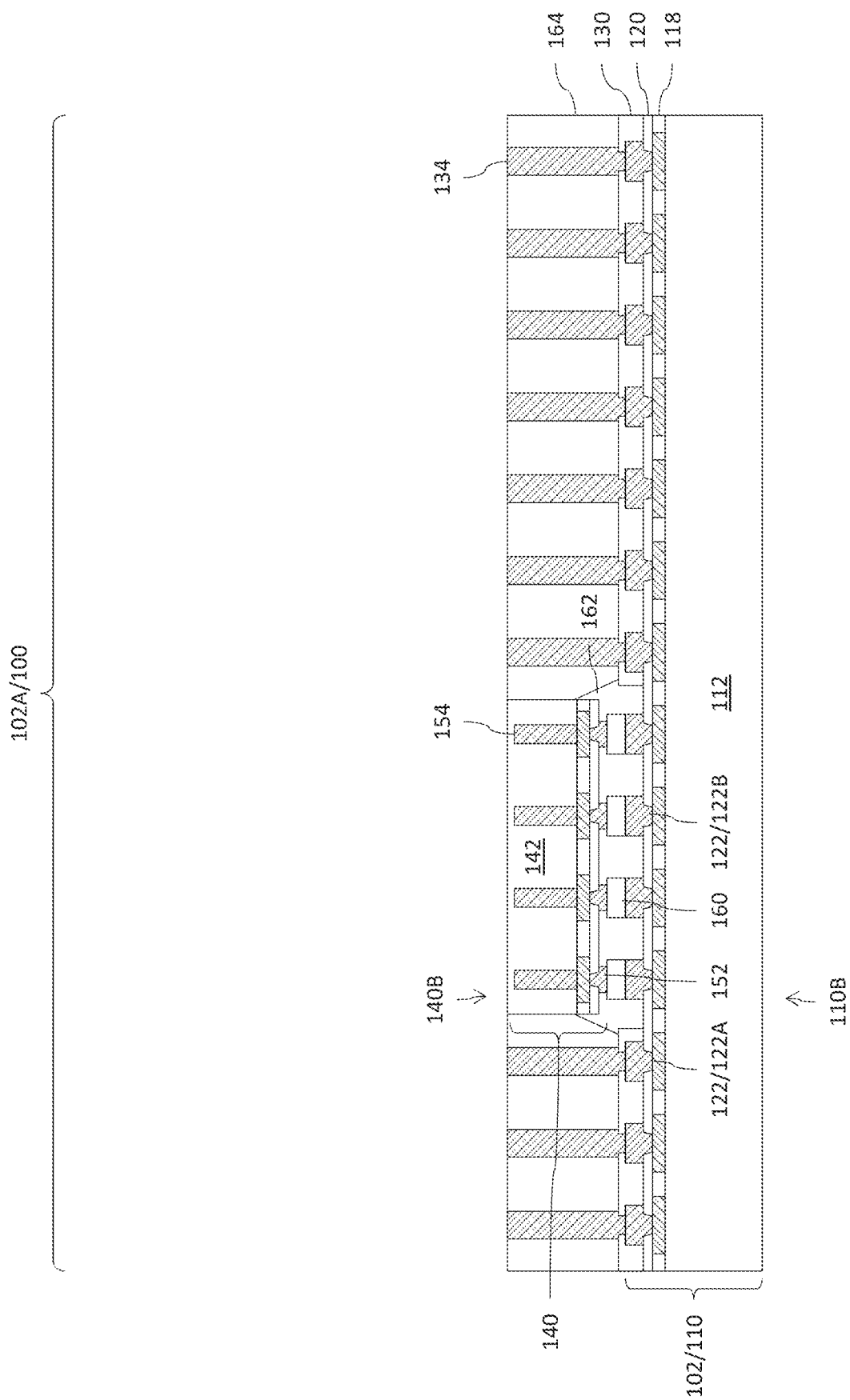

In FIG. 7, a planarization process is performed on the encapsulant 164 to expose the conductive vias 134 and the back side 140B of the second integrated circuit die 140. The planarization process may remove material of the encapsulant 164, the conductive vias 134, and/or semiconductor substrate 142 until the conductive vias 134 and the back side 140B of the second integrated circuit die 140 are exposed. Top surfaces of the planarized components are coplanar after the planarization process. The planarization process may be, for example, a chemical-mechanical polish (CMP), a grinding process, an etch-back process, or the like.

In some embodiments, the planarization process includes thinning the semiconductor substrate 142, which can help more easily expose the conductive vias 154 at the back side 140B of the second integrated circuit die 140 in subsequent processing. The thinning process may be, for example, a chemical-mechanical polish (CMP), a grinding process, an etch-back process, or the like. The conductive vias 154 remain buried in the semiconductor substrate 142 even when the semiconductor substrate 142 is thinned at this step of processing. After the planarization process, the encapsulant 164 and the dielectric layer 130 can have a combined thickness, for example, in the range of about 30 μm to about 50 μm, such as about 50 μm.

Optionally, the semiconductor substrate 112 can be thinned, which can help reduce the overall thickness of the die stack 100. The thinning process may be, for example, a chemical-mechanical polish (CMP), a grinding process, an etch-back process, or the like, which is performed at the back side 110B of the first integrated circuit die 110. After the thinning process, the semiconductor substrate 112 can have a thickness, for example, in the range of about 100 μm to about 150 μm, such as about 130 μm.

Figure 8:
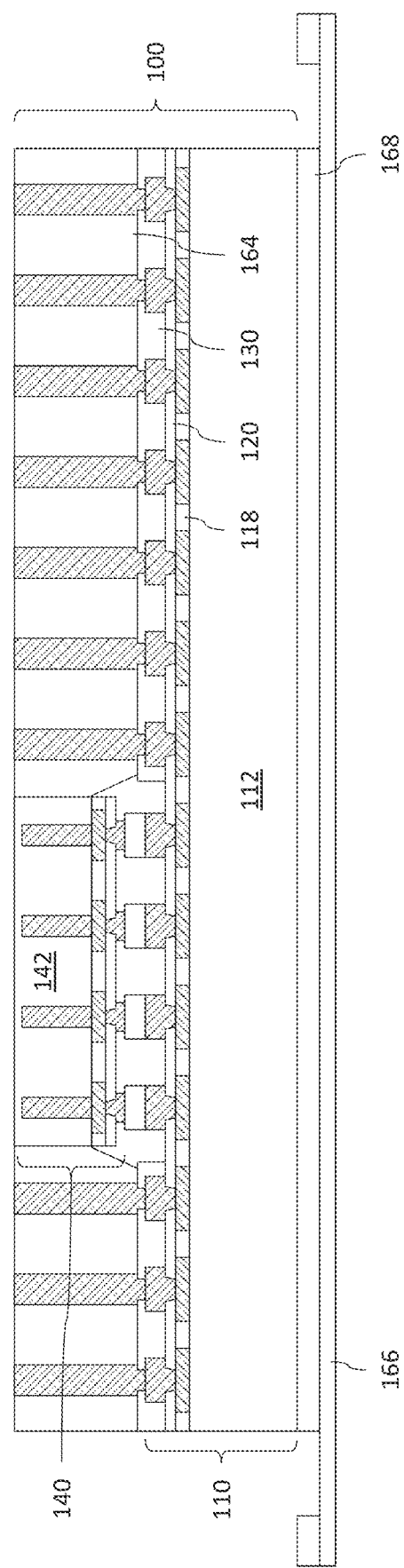

In FIG. 8, a singulation process is performed by sawing along scribe line regions, e.g., around the device region 102A. The singulation process includes sawing the wafer 102, the dielectric layer 130, and the encapsulant 164. The singulation process separates the device region 102A (comprising the first integrated circuit die 110) from adjacent device regions (not illustrated) of the wafer 102 to form a die stack 100 comprising the first integrated circuit die 110. After singulation the semiconductor substrate 112, the dielectric layer 118, the passivation layer(s) 120, the dielectric layer 130, and the encapsulant 164 are laterally coterminous.

An adhesive 168 is formed on the back side 110B of the first integrated circuit die 110. As discussed further below, the adhesive 168 will be used to adhere the die stack 100 to another element in subsequent processing. The adhesive 168 may be any suitable adhesive, epoxy, die attach film (DAF), or the like. In the embodiment shown, the adhesive 168 is applied to the back side 110B (see FIG. 7) of the first integrated circuit die 110 before singulating to separate the first integrated circuit die 110. In another embodiment, the adhesive 168 is not applied until a later processing step.

After singulation, the die stack 100 can be placed on, e.g., a tape 166. In embodiments where the adhesive 168 is applied to the back side 110B (see FIG. 7) of the first integrated circuit die 110, the adhesive 168 can be used to adhere the die stack 100 to the tap 166.

FIGS. 9, 10, 11, 12, 13, 14, 15, 16, 17, and 18A are cross-sectional views of intermediate steps during a process for forming an integrated circuit package implementing the die stack 100, in accordance with some embodiments. The die stack 100 is packaged in an integrated circuit package 200. Packaging of devices in one package region 202A is illustrated, but it should be appreciated that any number of package regions may be simultaneously formed. The package region 202A will be singulated in subsequent processing. The singulated integrated circuit package 200 may be a fan-out package, such as an integrated fan-out (InFO) package. The singulated integrated circuit package 200 is then mounted to a package substrate to form a completed system.

Figure 9:
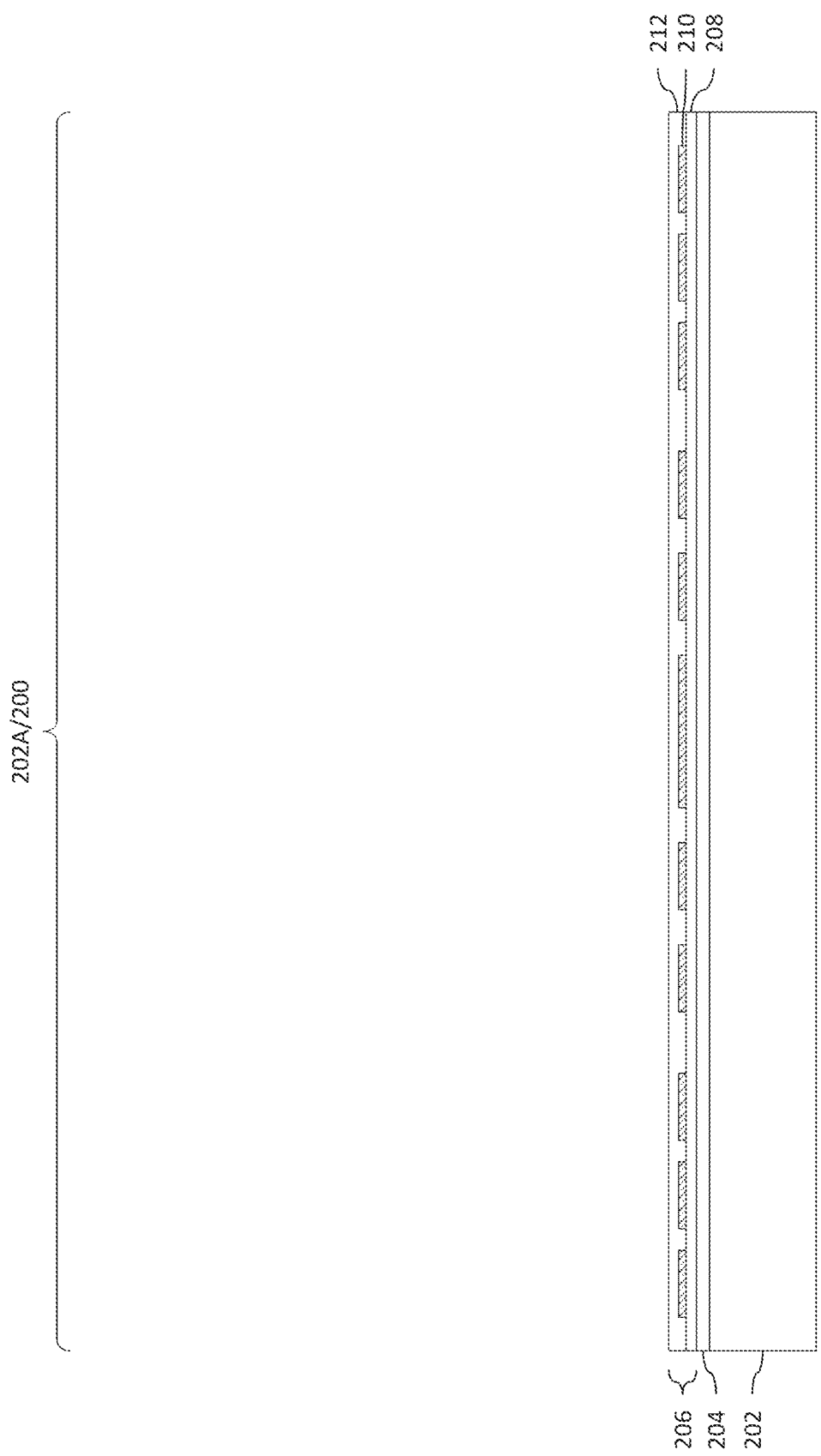
FIGS. 9, 10, 11, 12, 13, 14, 15, 16, 17, and 18A are cross-sectional views of intermediate steps during a process for forming an integrated circuit package implementing a die stack, in accordance with some embodiments.

In FIG. 9, a carrier substrate 202 is provided, and a release layer 204 is formed on the carrier substrate 202. The carrier substrate 202 may be a glass carrier substrate, a ceramic carrier substrate, or the like. The carrier substrate 202 may be a wafer, such that multiple packages can be formed on the carrier substrate 202 simultaneously. The release layer 204 may be formed of a polymer-based material, which may be removed along with the carrier substrate 202 from the overlying structures that will be formed in subsequent steps. In some embodiments, the release layer 204 is an epoxy-based thermal-release material, which loses its adhesive property when heated, such as a light-to-heat-conversion (LTHC) release coating. In other embodiments, the release layer 204 may be an ultra-violet (UV) glue, which loses its adhesive property when exposed to UV lights. The release layer 204 may be dispensed as a liquid and cured, may be a laminate film laminated onto the carrier substrate 202, or may be the like. The top surface of the release layer 204 may be leveled and may have a high degree of planarity.

A back-side redistribution structure 206 can optionally be formed on the release layer 204. In the embodiment shown, the back-side redistribution structure 206 includes a dielectric layer 208, a metallization pattern 210 (sometimes referred to as redistribution layers or redistribution lines), and a dielectric layer 212. The back-side redistribution structure 206 is optional. In some embodiments, a dielectric layer without metallization patterns is formed on the release layer 204 in lieu of the back-side redistribution structure 206.

The dielectric layer 208 is formed on the release layer 204. The bottom surface of the dielectric layer 208 may be in contact with the top surface of the release layer 204. In some embodiments, the dielectric layer 208 is formed of a polymer, such as PBO, polyimide, a BCB-based polymer, or the like. In other embodiments, the dielectric layer 208 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 208 may be formed by any acceptable deposition process, such as spin coating, CVD, laminating, the like, or a combination thereof.

The metallization pattern 210 is formed on the dielectric layer 208. As an example to form the metallization pattern 210, a seed layer is formed over the dielectric layer 208. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 210. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 210.

The dielectric layer 212 is formed on the metallization pattern 210 and the dielectric layer 208. In some embodiments, the dielectric layer 212 is formed of a polymer, which may be a photo-sensitive material such as PBO, polyimide, BCB, or the like, that may be patterned using a lithography mask. In other embodiments, the dielectric layer 212 is formed of a nitride such as silicon nitride; an oxide such as silicon oxide, PSG, BSG, BPSG; or the like. The dielectric layer 212 may be formed by spin coating, lamination, CVD, the like, or a combination thereof.

It should be appreciated that the back-side redistribution structure 206 may include any number of dielectric layers and metallization patterns. If more dielectric layers and metallization patterns are to be formed, steps and processes discussed above may be repeated. The metallization patterns may include conductive lines and conductive vias. The conductive vias may be formed during the formation of the metallization pattern by forming the seed layer and conductive material of the metallization pattern in the opening of an underlying dielectric layer. The conductive vias may therefore interconnect and electrically couple the various conductive lines.

Figure 10:
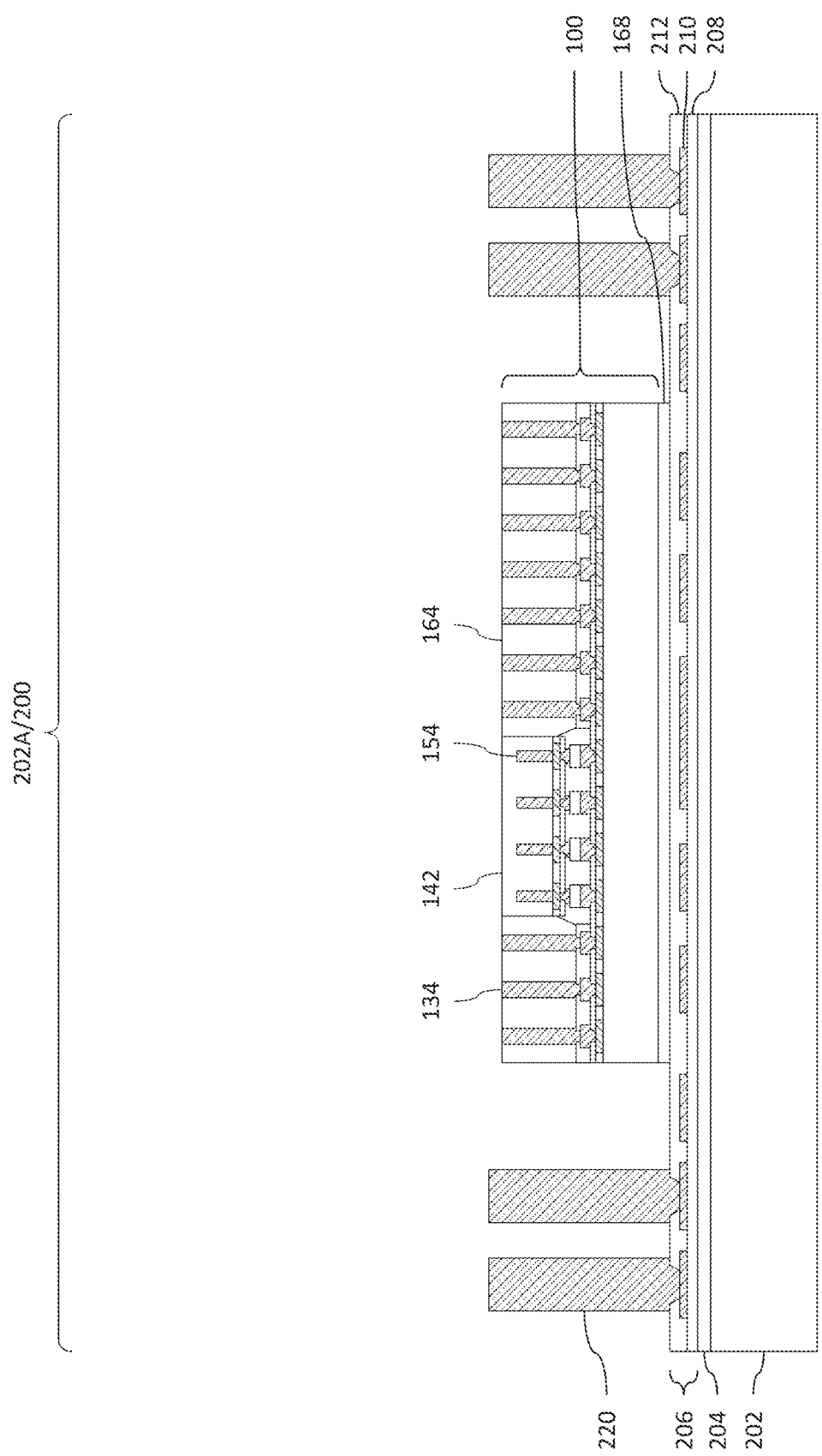

In FIG. 10, conductive vias 220 are formed extending through the topmost dielectric layer of the back-side redistribution structure 206 (e.g., the dielectric layer 212), and away from the carrier substrate 202. The conductive vias 220 are connected to the topmost metallization pattern of the back-side redistribution structure 206 (e.g., the metallization pattern 210). The conductive vias 220 are optional, and as discussed further below, may be omitted. For example, the conductive vias 220 may (or may not) be omitted in embodiments where the back-side redistribution structure 206 is omitted. As an example to form the conductive vias 220, the dielectric layer 212 can be patterned to form openings exposing portions of the metallization pattern 210. The patterning may be formed by an acceptable process, such as by exposing the dielectric layer 212 to light when the dielectric layer 212 is a photo-sensitive material or by etching using, for example, an anisotropic etch. If the dielectric layer 212 is a photo-sensitive material, the dielectric layer 212 can be developed after the exposure. A seed layer is then formed over the dielectric layer 212 and portions of the metallization pattern 210 exposed by the openings. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive vias 220.

The singulated die stack 100 is then placed adjacent the conductive vias 220. The die stack 100 can be placed on the back-side redistribution structure 206 (e.g., the dielectric layer 212) when the back-side redistribution structure 206 is formed, or can be placed on the release layer 204 when the back-side redistribution structure 206 is omitted. The adhesive 168 is used to adhere the singulated die stack 100 to the underlying layer (e.g., the dielectric layer 212 or the release layer 204). In embodiments where the adhesive 168 is not applied to the back side 110B of the first integrated circuit die 110, it can instead be applied over the surface of the carrier substrate 202, e.g., on the dielectric layer 212 or release layer 204.

Figure 11:
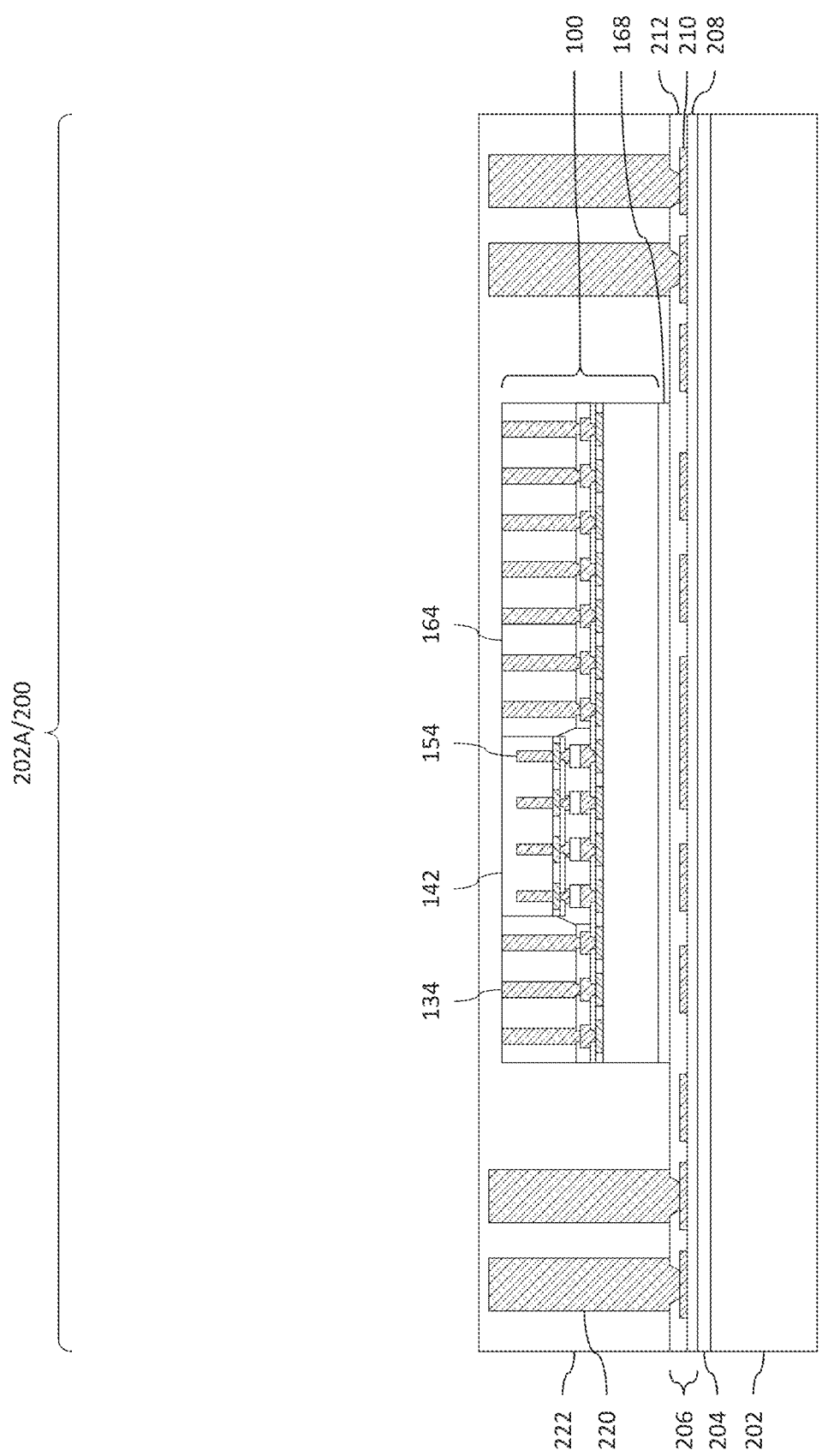

In FIG. 11, an encapsulant 222 is formed on and around the various components. After formation, the encapsulant 222 encapsulates the conductive vias 220 and the die stack 100. The encapsulant 222 may be a molding compound, epoxy, or the like. The encapsulant 222 may be applied by compression molding, transfer molding, or the like, and is formed over the carrier substrate 202 such that the conductive vias 220 and/or the die stack 100 are buried or covered. The encapsulant 222 may be applied in liquid or semi-liquid form and then subsequently cured. In some embodiments, the encapsulants 164, 222 comprise different molding materials. For example, the encapsulant 222 can be formed of a molding compound, and the encapsulant 164 can be formed of a molding underfill, e.g., a molding material that has fillers of a smaller size than the molding material used for the encapsulant 222.

Figure 12:
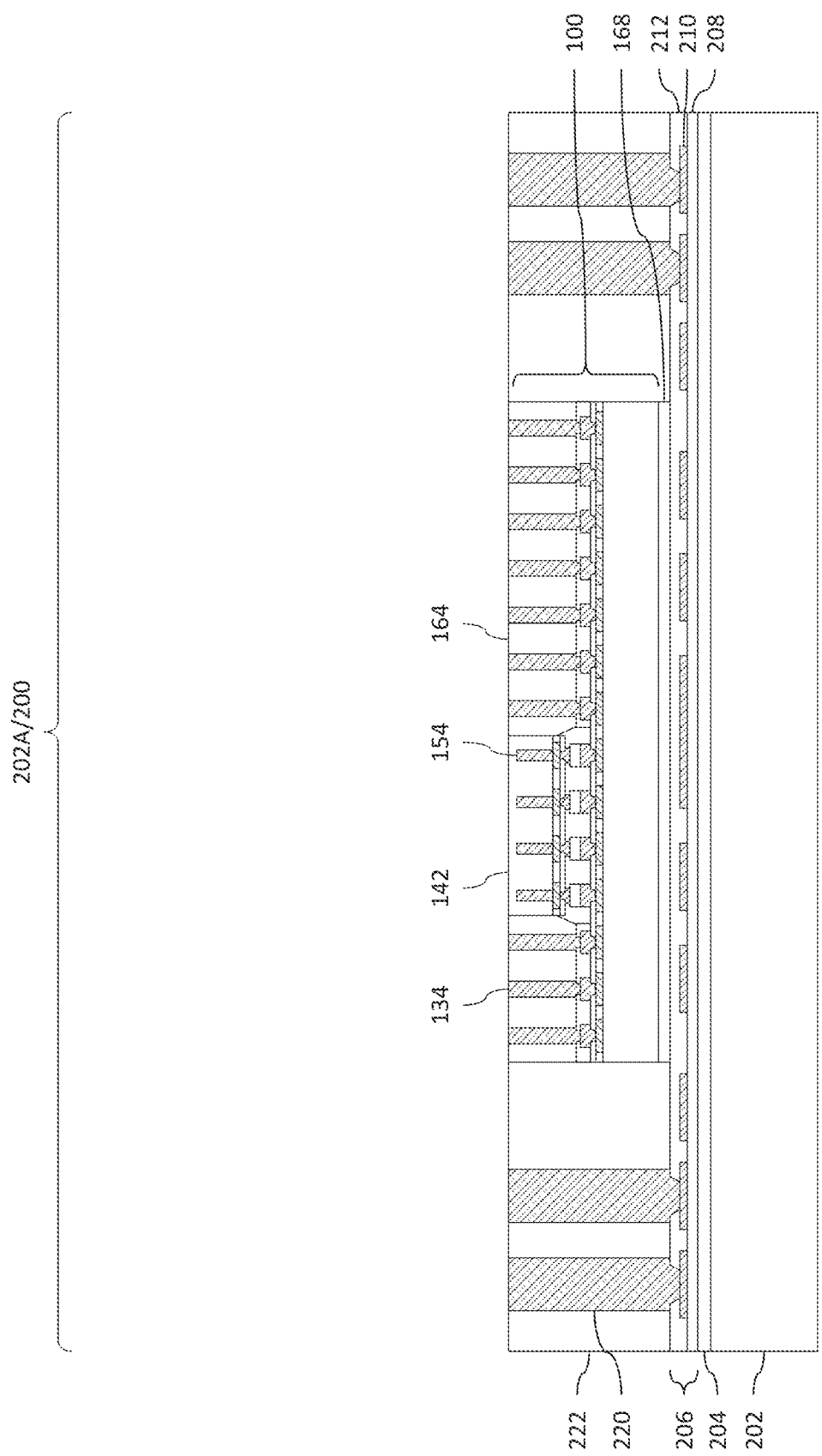
Figure 13:
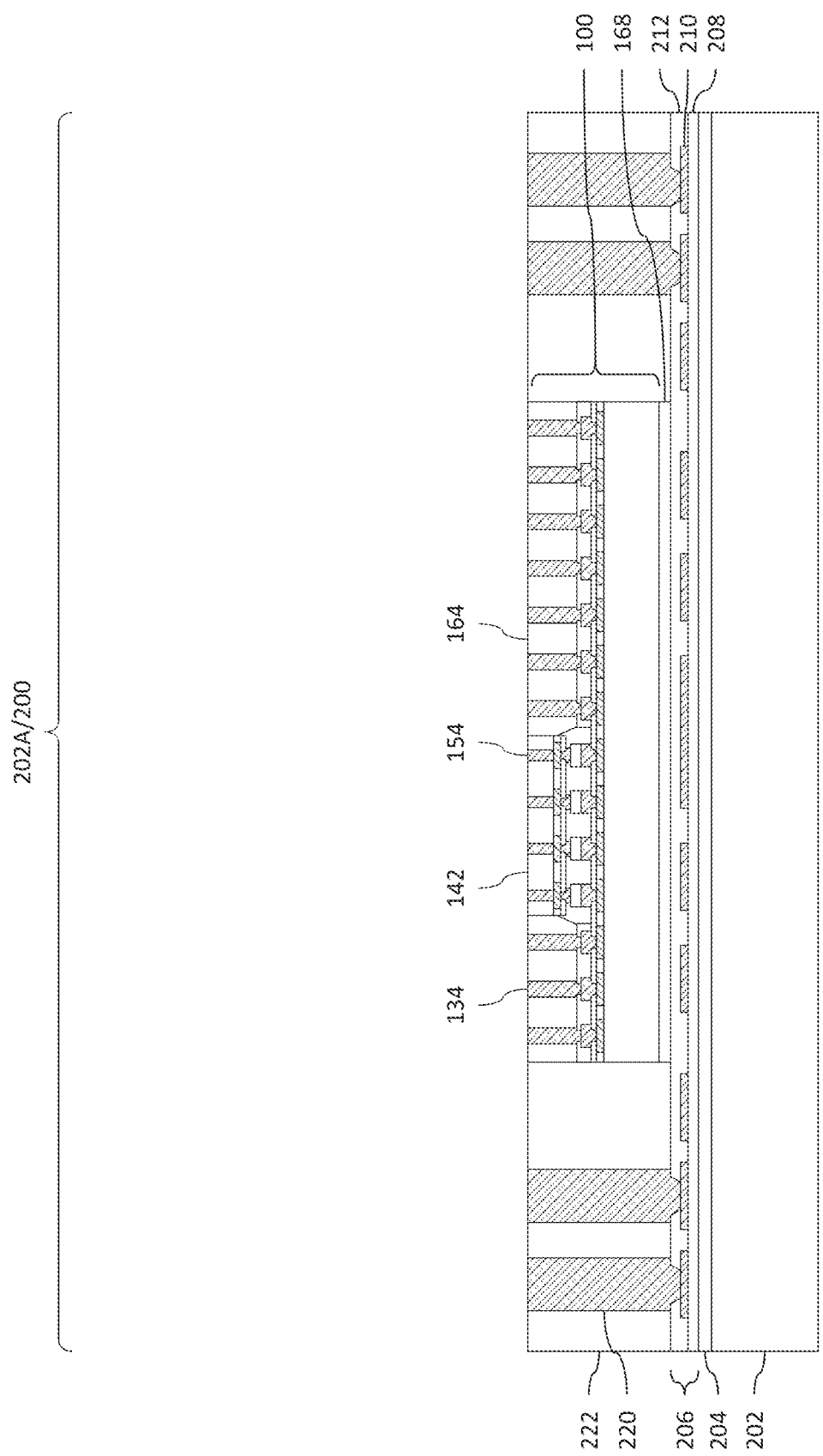
Figure 14:
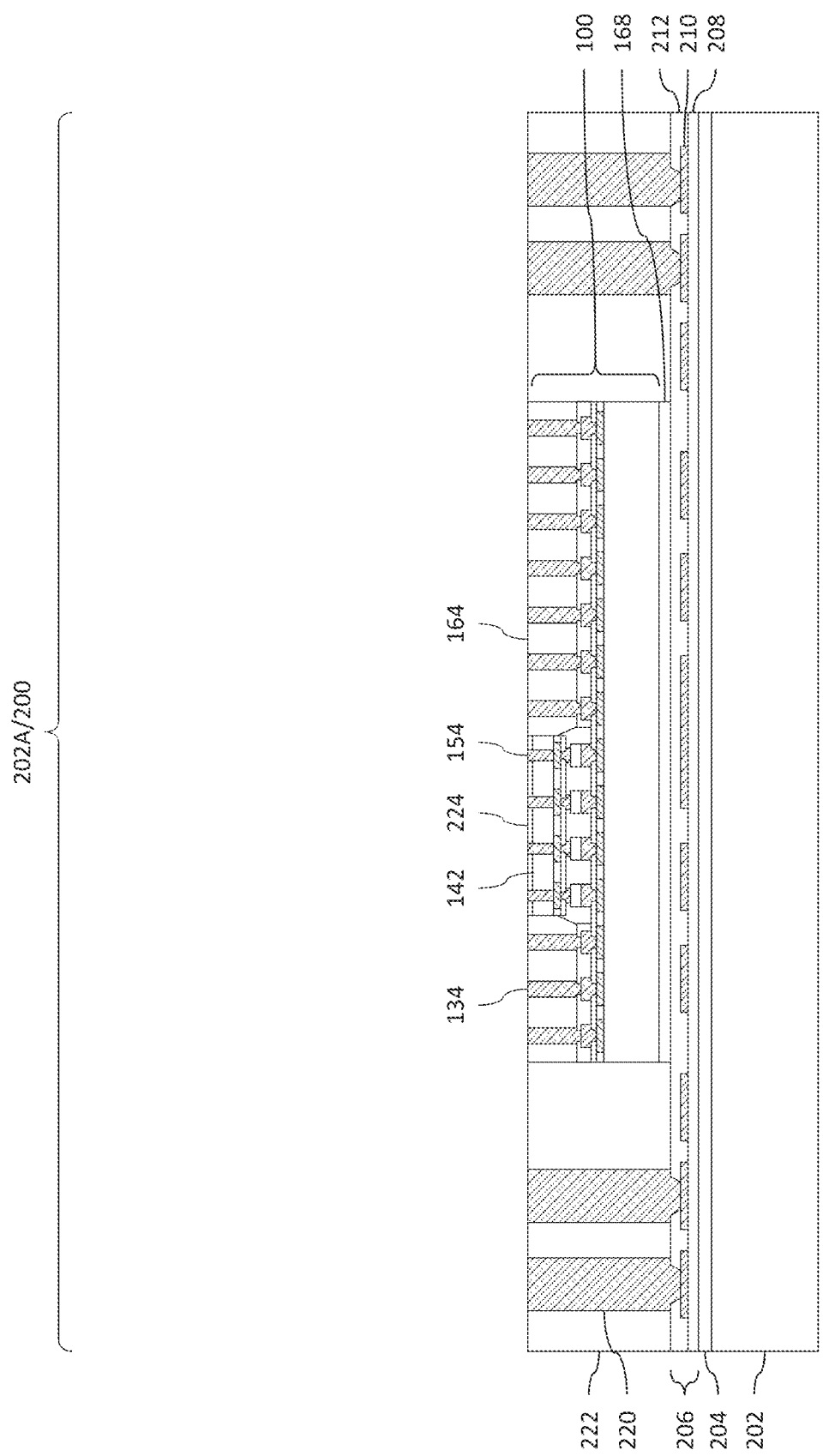

FIGS. 12, 13, and 14 illustrate a planarization process that can be performed on the encapsulant 222 and die stack 100 to expose the conductive vias 134, 154, 220. The planarization process removes material of the semiconductor substrate 142, the conductive vias 134, 154, 220, and/or the encapsulants 164, 222 until the conductive vias 134, 154, 220 are exposed. Top surfaces of the planarized features are coplanar after the planarization process. After planarization, the conductive vias 134 extend through the encapsulant 164 (e.g., the conductive vias 134 are through vias) and the conductive vias 220 extend through the encapsulant 222 (e.g., the conductive vias 220 are through vias). In accordance with some embodiments, the planarization process includes a combination of grinding, etching, and CMP processes. FIGS. 12, 13, and 14 are an example of a planarization process that could be used to expose the conductive vias 134, 154, 220. It should be appreciated that other planarization processes may also be used. For example, other combinations of grinding, etching, and/or CMP processes may be used to expose the conductive vias 134, 154, 220.

In FIG. 12, the encapsulant 222 is ground to expose the die stack 100, e.g., the semiconductor substrate 142. One or more grinding process(es) can be performed, which may (or may not) also expose the conductive vias 220. The semiconductor substrate 142 can also be thinned during the grinding process(es). Thinning the semiconductor substrate 142 at this step of processing can help reduce the costs of exposing the conductive vias 154 in subsequent processing steps. In some embodiments, a first grinding process is performed to expose the semiconductor substrate 142, and a second grinding process is performed to thin the semiconductor substrate 142, where the second grinding process is performed at a lesser removal rate than the first grinding process. For example, the first grinding process can be performed with a first grinding head that has a first surface roughness, and the second grinding process can be performed with a second grinding head that has a second surface roughness, where the second surface roughness is less than the first surface roughness. Thinning the semiconductor substrate 142 at a slower removal rate can help avoid overgrinding that may damage the conductive vias 154.

In FIG. 13, the encapsulant 222 and semiconductor substrate 142 are ground to expose the conductive vias 154. One or more grinding process(es) can be performed, which also exposes the conductive vias 220 if they are not already exposed. In some embodiments, a third grinding process is performed to thin the semiconductor substrate 142 and expose the conductive vias 154, where the third grinding process is performed at a lesser removal rate than the first and second grinding processes discussed with respect to FIG. 12. For example, the third grinding process can be performed with a grinding head that has a surface roughness less than the surface roughness of the grinding heads used in the first and second grinding processes discussed with respect to FIG. 12. Continuing the previous example, the third grinding process can be performed with a third grinding head that has a third surface roughness, where the third surface roughness is less than the first and second surface roughness discussed with respect to FIG. 12. Exposing the conductive vias 154 at a slower removal rate can help avoid overgrinding that may damage the conductive vias 154.

In FIG. 14, a barrier layer 224 can optionally be formed around the conductive vias 154. The barrier layer 224 can help electrically isolate the conductive vias 154 from one another, thus avoiding shorting. As an example to form the barrier layer 224, the semiconductor substrate 142 can be recessed to expose sidewall portions of the conductive vias 154. The recessing may be by an etching process, such as a dry etch. A barrier material can then be formed in the recesses. The barrier material can be a dielectric material such as a low temperature polyimide material, although any other suitable dielectric, such as PBO, an encapsulant, combinations of these, or the like may also be utilized. A planarization process, such as a CMP, grinding, or etchback, can be performed to remove excess portions of the barrier material over the semiconductor substrate 142. The remaining portions of the barrier material in the recesses forms the barrier layer 224. After the barrier layer 224 is formed, it is laterally surrounded by the encapsulant 164.

Figure 15:
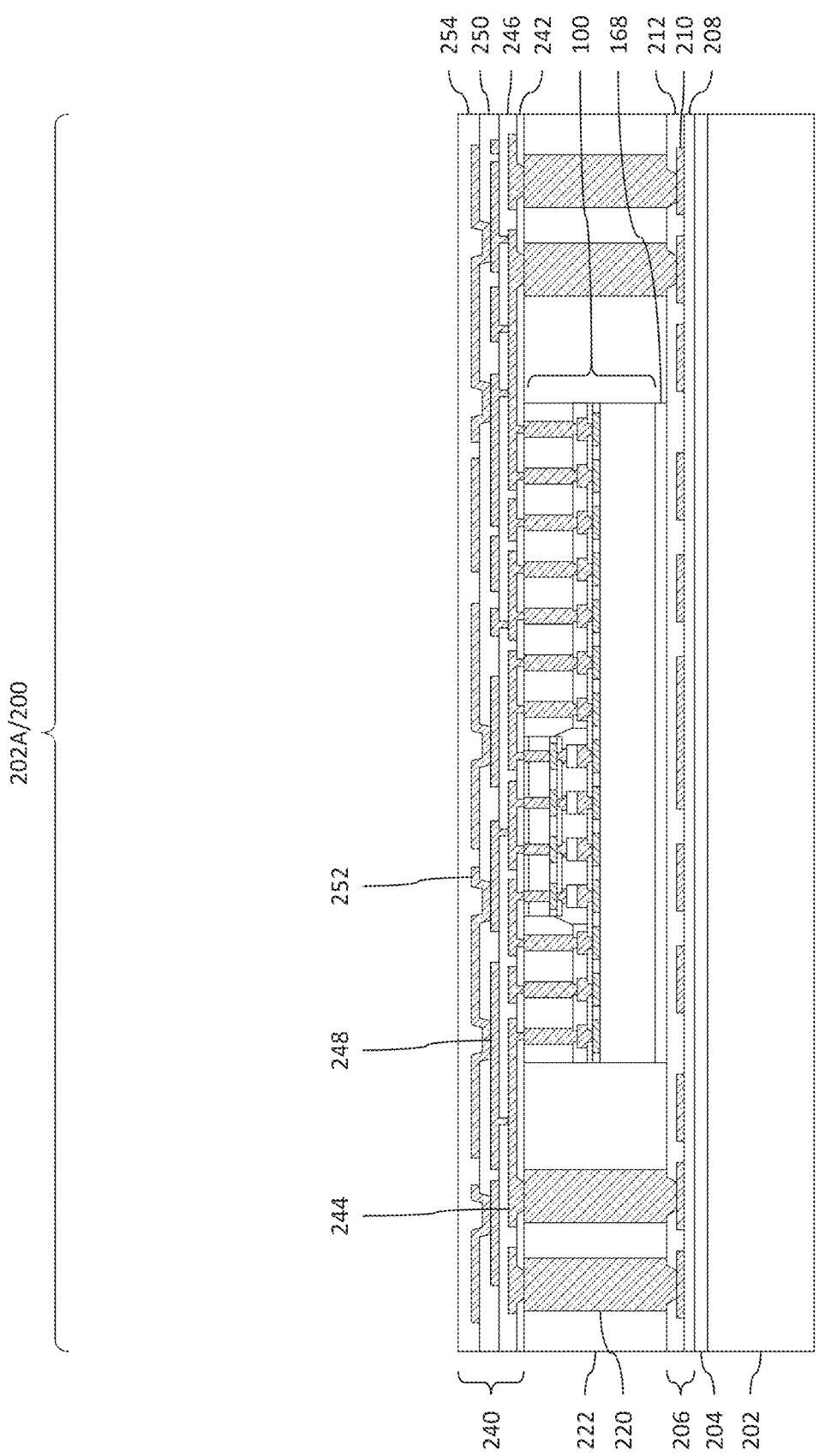

In FIG. 15, a front-side redistribution structure 240 is formed over the encapsulant 222, conductive vias 220, and die stack 100. The front-side redistribution structure 240 includes dielectric layers 242, 246, 250, 254 and metallization patterns 244, 248, 252. The metallization patterns may also be referred to as redistribution layers or redistribution lines. The front-side redistribution structure 240 is shown as an example having three layers of metallization patterns. More or fewer dielectric layers and metallization patterns may be formed in the front-side redistribution structure 240. If fewer dielectric layers and metallization patterns are to be formed, steps and process discussed below may be omitted. If more dielectric layers and metallization patterns are to be formed, steps and processes discussed below may be repeated.

As an example to form the front-side redistribution structure 240, the dielectric layer 242 can be deposited on the encapsulant 222, conductive vias 220, and die stack 100. The barrier layer 224 thus contacts the dielectric layer 242. In some embodiments, the dielectric layer 242 is formed of a photo-sensitive material such as PBO, polyimide, BCB, or the like, which may be patterned using a lithography mask. The dielectric layer 242 may be formed by spin coating, lamination, CVD, the like, or a combination thereof. The dielectric layer 242 is then patterned. The patterning forms openings exposing portions of the conductive vias 134, 154, 220. The patterning may be by an acceptable process, such as by exposing the dielectric layer 242 to light when the dielectric layer 242 is a photo-sensitive material or by etching using, for example, an anisotropic etch. If the dielectric layer 242 is a photo-sensitive material, the dielectric layer 242 can be developed after the exposure.

The metallization pattern 244 is then formed. The metallization pattern 244 includes line portions (also referred to as conductive lines) on and extending along the major surface of the dielectric layer 242. The metallization pattern 244 further includes via portions (also referred to as conductive vias) extending through the dielectric layer 242 to be connected to the conductive vias 134, 154, 220. As an example to form the metallization pattern 244, a seed layer is formed over the dielectric layer 242 and in the openings extending through the dielectric layer 242. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 244. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 244. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 246 is then deposited on the metallization pattern 244 and dielectric layer 242. The dielectric layer 246 can be formed in a similar manner and of similar materials as the dielectric layer 242.

The metallization pattern 248 is then formed. The metallization pattern 248 includes line portions on and extending along the major surface of the dielectric layer 246. The metallization pattern 248 further includes via portions extending through the dielectric layer 246 to be connected to the metallization pattern 244. The metallization pattern 248 can be formed in a similar manner and of similar materials as the metallization pattern 244. In some embodiments, the metallization pattern 248 has a different size than the metallization pattern 244. For example, the conductive lines and/or vias of the metallization pattern 248 may be wider or thicker than the conductive lines and/or vias of the metallization pattern 244. Further, the metallization pattern 248 may be formed to a greater pitch than the metallization pattern 244.

The dielectric layer 250 is then deposited on the metallization pattern 248 and dielectric layer 246. The dielectric layer 250 can be formed in a similar manner and of similar materials as the dielectric layer 242.

The metallization pattern 252 is then formed. The metallization pattern 252 includes line portions on and extending along the major surface of the dielectric layer 250. The metallization pattern 252 further includes via portions extending through the dielectric layer 250 to be connected to the metallization pattern 248. The metallization pattern 252 can be formed in a similar manner and of similar materials as the metallization pattern 244. The metallization pattern 252 is the topmost metallization pattern of the front-side redistribution structure 240. As such, all of the intermediate metallization patterns of the front-side redistribution structure 240 (e.g., the metallization patterns 244 and 248) are disposed between the metallization pattern 252 and the die stack 100. In some embodiments, the metallization pattern 252 has a different size than the metallization patterns 244 and 248. For example, the conductive lines and/or vias of the metallization pattern 252 may be wider or thicker than the conductive lines and/or vias of the metallization patterns 244 and 248. Further, the metallization pattern 252 may be formed to a greater pitch than the metallization pattern 248.

The dielectric layer 254 is then deposited on the metallization pattern 252 and dielectric layer 250. The dielectric layer 254 can be formed in a similar manner and of similar materials as the dielectric layer 242.

Figure 16:
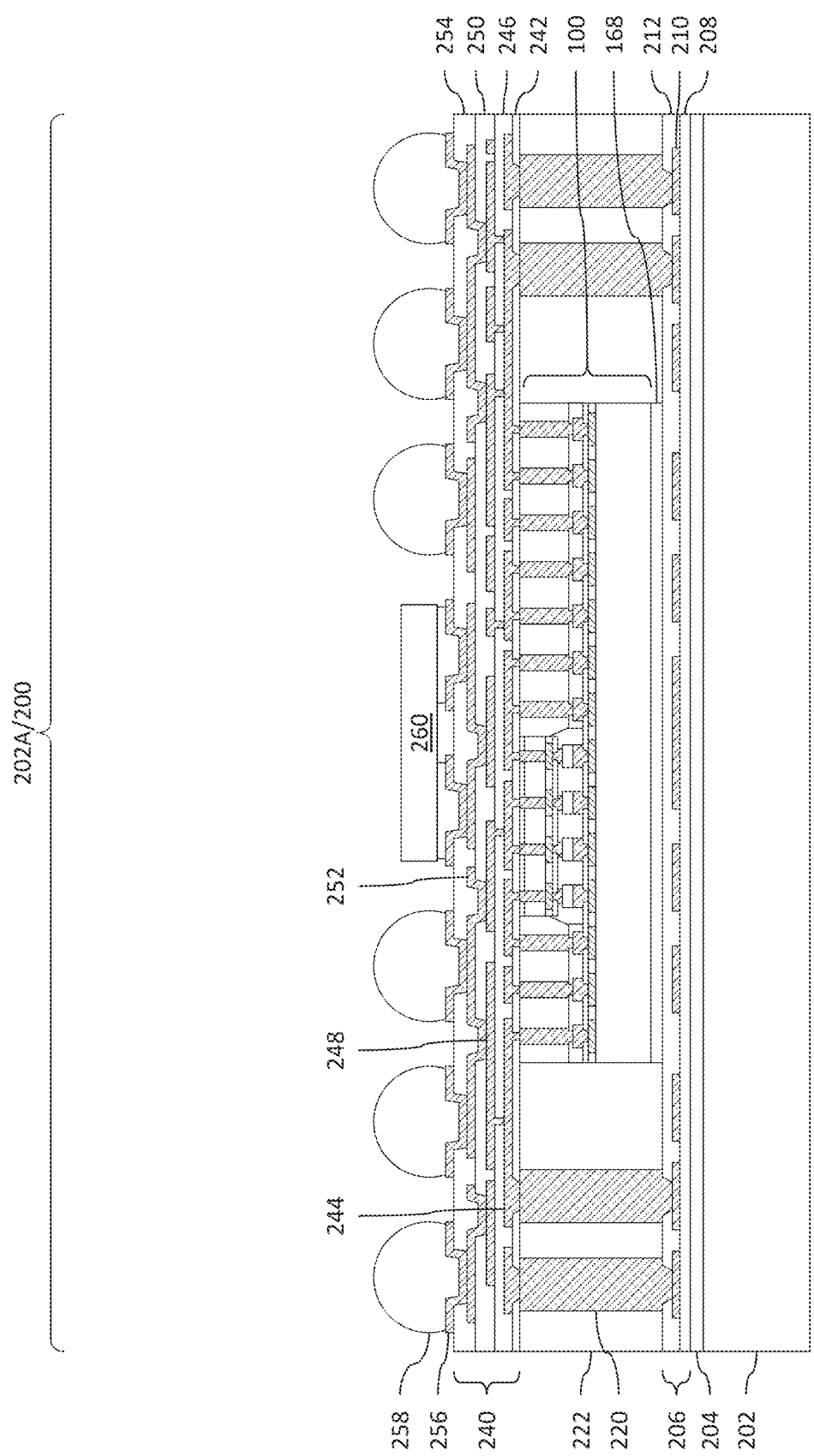

In FIG. 16, under-bump metallurgies (UBMs) 256 are formed for external connection to the front-side redistribution structure 240. The UBMs 256 have bump portions on and extending along the major surface of the dielectric layer 254, and have via portions extending through the dielectric layer 254 to be connected to the metallization pattern 252. As a result, the UBMs 256 are electrically coupled to the conductive vias 134, 154, 220. The UBMs 256 may be formed of a similar material as the metallization pattern 244. In some embodiments, the UBMs 256 have a different size than the metallization patterns 244, 248, 252.

Conductive connectors 258 are then formed on the UBMs 256. The conductive connectors 258 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 258 may include a conductive material such as solder, copper, aluminum, gold, nickel, silver, palladium, tin, the like, or a combination thereof. In some embodiments, the conductive connectors 258 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 258 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

One or more integrated passive devices (IPDs) 260 are optionally connected to the UBMs 256 with a subset of the conductive connectors 258. The IPDs 260 may be surface mount devices (SMDs), 2-terminal integrated passive devices (IPDs), multi-terminal IPDs, or other types of passive devices. The IPDs 260 can include a main structure and one or more passive devices in the main structure. The main structure can be, e.g., a semiconductor substrate, an encapsulant, or the like. The passive devices may include capacitors, resistors, inductors, the like, or a combination thereof, which can be formed in and/or on the main structure. The IPDs 260 can be connected to the UBMs 256 by reflowing the conductive connectors 258. In some embodiments (discussed further below with respect to FIGS. 19 through 23B), the die stack 100 can include a passive device bonded to dies of the die stack 100, and thus IPDs 260 can be omitted. In some embodiments, an underfill (not shown) can be formed between the topmost dielectric layer of the front-side redistribution structure 240 (e.g., the dielectric layer 254) and each of the IPDs 260.

Figure 17:
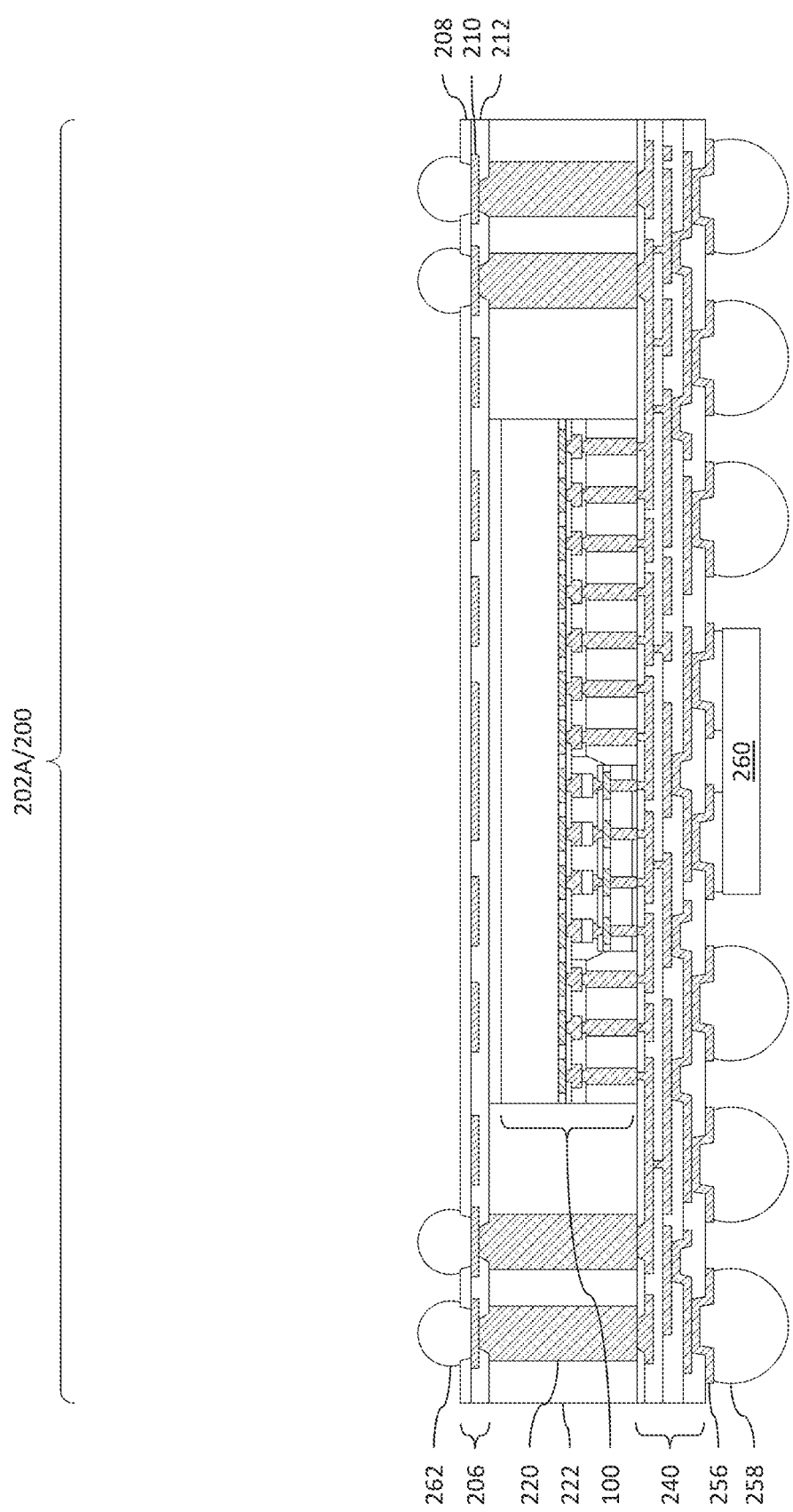

In FIG. 17, a carrier substrate debonding is performed to detach (de-bond) the carrier substrate 202 from the back-side redistribution structure 206, e.g., the dielectric layer 208. In accordance with some embodiments, the de-bonding includes projecting a light such as a laser light or an UV light on the release layer 204 so that the release layer 204 decomposes under the heat of the light and the carrier substrate 202 can be removed. The structure can then be flipped over and placed on, e.g., a tape.

Further, conductive connectors 262 are formed through the dielectric layer 208 of the back-side redistribution structure 206. Openings can be formed through the dielectric layer 208 of the back-side redistribution structure 206, exposing portions of the metallization patterns 210. The openings may be formed, for example, using laser drilling, etching, or the like. The conductive connectors 262 are formed in the openings, and are connected to exposed portions of the metallization patterns 210. The conductive connectors 262 can be formed in a similar manner and of similar materials as the conductive connectors 258.

Figure 18A:
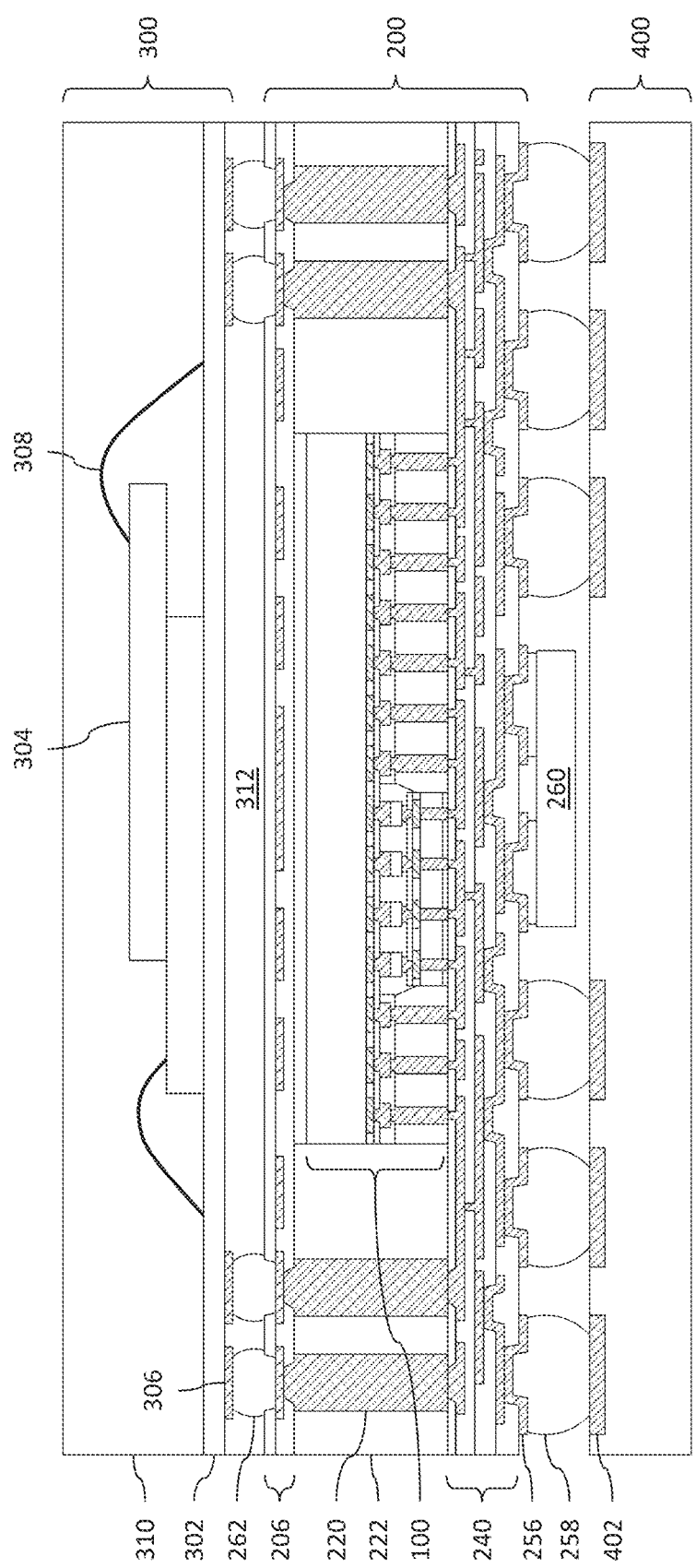

In FIG. 18A, a singulation process is performed by sawing along scribe line regions, e.g., around the package region 202A. The singulation process includes sawing the redistribution structures 206, 240 and encapsulant 222. The singulation process separates the package region 202A from adjacent package regions (not illustrated) to form an integrated circuit package 200. After singulation, the redistribution structures 206, 240 and encapsulant 222 are laterally coterminous.

Another integrated circuit package 300 can be attached to the integrated circuit package 200 to form a package-on-package structure. The integrated circuit package 300 may be a memory device. The integrated circuit package 300 can be attached to the integrated circuit package 200 before or after the integrated circuit package 200 is singulated.

The integrated circuit package 300 includes a substrate 302 and one or more dies 304 connected to the substrate 302. In some embodiments one or more stacks of dies 304 are connected to the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 302 is, in another embodiment, based on an insulating core such as a fiberglass reinforced resin core. One example core material is fiberglass resin such as FR4. Other core materials include bismaleimide-triazine (BT) resin, other printed circuit board (PCB) materials or films, or the like. Build up films such as Ajinomoto build-up film (ABF) or other laminates may be used for substrate 302.

The substrate 302 may include active and passive devices (not shown). As one of ordinary skill in the art will recognize, a wide variety of devices such as transistors, capacitors, resistors, combinations of these, and the like may be used to generate the structural and functional requirements of the design for the integrated circuit package 300. The devices may be formed using any suitable methods. The substrate 302 may also include metallization layers (not shown) and through vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 306 on a side the substrate 302, to connect to the conductive connectors 262. In some embodiments, the bond pads 306 are formed by forming recesses (not shown) into dielectric layers (not shown) on the side of the substrate 302. The recesses may be formed to allow the bond pads 306 to be embedded into the dielectric layers. In other embodiments, the recesses are omitted as the bond pads 306 may be formed on the dielectric layer. In some embodiments, the bond pads 306 include a thin seed layer (not shown) made of copper, titanium, nickel, gold, palladium, the like, or a combination thereof. The conductive material of the bond pads 306 may be deposited over the thin seed layer. The conductive material may be formed by an electro-chemical plating process, an electroless plating process, CVD, ALD, PVD, the like, or a combination thereof. In an embodiment, the conductive material of the bond pads 306 is copper, tungsten, aluminum, silver, gold, the like, or a combination thereof.

In an embodiment, the bond pads 306 are UBMs that include three layers of conductive materials, such as a layer of titanium, a layer of copper, and a layer of nickel. For example, the bond pads 306 may be formed from copper, may be formed on a layer of titanium (not shown), and have a nickel finish, which may improve the shelf life of the integrated circuit package 300, which may be particularly advantageous when the integrated circuit package 300 is a memory device such as a DRAM module. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the bond pads 306. Any suitable materials or layers of material that may be used for the bond pads 306 are fully intended to be included within the scope of the current application.

In the illustrated embodiment, the dies 304 are connected to the substrate 302 by wire bonds 308, although other connections may be used, such as conductive bumps. In an embodiment, the dies 304 are stacked memory dies. For example, the dies 304 may be memory dies such as low-power (LP) double data rate (DDR) memory modules, such as LPDDR1, LPDDR2, LPDDR3, LPDDR4, or the like.

The dies 304 and the wire bonds 308 (when present) may be encapsulated by a molding material 310. The molding material 310 may be molded on the dies 304 and the wire bonds 308, for example, using compression molding. In some embodiments, the molding material 310 is a molding compound, a polymer, an epoxy, silicon oxide filler material, the like, or a combination thereof. A curing process may be performed to cure the molding material 310; the curing process may be a thermal curing, a UV curing, the like, or a combination thereof. In some embodiments, the dies 304 are buried in the molding material 310, and after the curing of the molding material 310, a planarization step, such as a grinding, is performed to remove excess portions of the molding material 310 and provide a substantially planar surface for the integrated circuit package 300.

After the integrated circuit package 300 is formed, the integrated circuit package 300 is attached to the integrated circuit package 200 by way of the conductive connectors 262. The conductive connectors 262 can be connected to the bond pads 306 by reflowing the conductive connectors 262. The dies 304 may thus be electrically coupled to the die stack 100 through the conductive connectors 262, the conductive vias 220, and the redistribution structures 206, 240.

In some embodiments, a solder resist (not shown) is formed on the side of the substrate 302 opposing the dies 304. The conductive connectors 262 may be disposed in openings in the solder resist to be connected to conductive features (e.g., the bond pads 306) in the substrate 302. The solder resist may be used to protect areas of the substrate 302 from external damage.

In some embodiments, the conductive connectors 262 have an epoxy flux (not shown) formed thereon before they are reflowed with at least some of the epoxy portion of the epoxy flux remaining after the integrated circuit package 300 is attached to the redistribution structure 206.

In some embodiments, an underfill 312 is formed between the redistribution structure 206 and the substrate 302, and surrounding the conductive connectors 262. The underfill 312 may reduce stress and protect the joints resulting from the reflowing of the conductive connectors 262. The underfill 312 may be formed by a capillary flow process after the integrated circuit package 300 is attached or may be formed by a suitable deposition method before the integrated circuit package 300 is attached. In embodiments where the epoxy flux is formed, it may act as the underfill 312. When the underfill 312 is formed before the integrated circuit package 300 is attached, the underfill 312 and the integrated circuit package 200 can be laterally coterminous.

The integrated circuit package 200 is then attached to a package substrate 400 using the conductive connectors 258. The package substrate 400 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 400 may be a SOI substrate. Generally, an SOI substrate includes a layer of a semiconductor material such as epitaxial silicon, germanium, silicon germanium, SOI, SGOI, or combinations thereof. The package substrate 400 is, in another embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for package substrate 400.

The package substrate 400 may include active and passive devices (not illustrated). Devices such as transistors, capacitors, resistors, combinations of these, and the like may be used to generate the structural and functional requirements of the design for the system. The devices may be formed using any suitable methods.

The package substrate 400 may also include metallization layers and vias (not illustrated) and bond pads 402 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 400 is substantially free of active and passive devices.

The conductive connectors 258 are reflowed to attach the UBMs 256 to the bond pads 402. The conductive connectors 258 connect the package substrate 400, including metallization layers in the package substrate 400, to the integrated circuit package 200, including metallization patterns of the redistribution structure 240. In some embodiments, surface mount passive devices (e.g., SMDs), not illustrated) may be attached to the package substrate 400, e.g., to the bond pads 402.

The conductive connectors 258 may have an epoxy flux (not illustrated) formed thereon before they are reflowed with at least some of the epoxy portion of the epoxy flux remaining after the integrated circuit package 200 is attached to the package substrate 400. This remaining epoxy portion may act as an underfill to reduce stress and protect the joints resulting from the reflowing the conductive connectors 258. In some embodiments, an underfill (not illustrated) may be formed between the integrated circuit package 200 and the package substrate 400, surrounding the conductive connectors 258. The underfill may be formed by a capillary flow process after the integrated circuit package 200 is attached or may be formed by a suitable deposition method before the integrated circuit package 200 is attached.

Figure 18B:
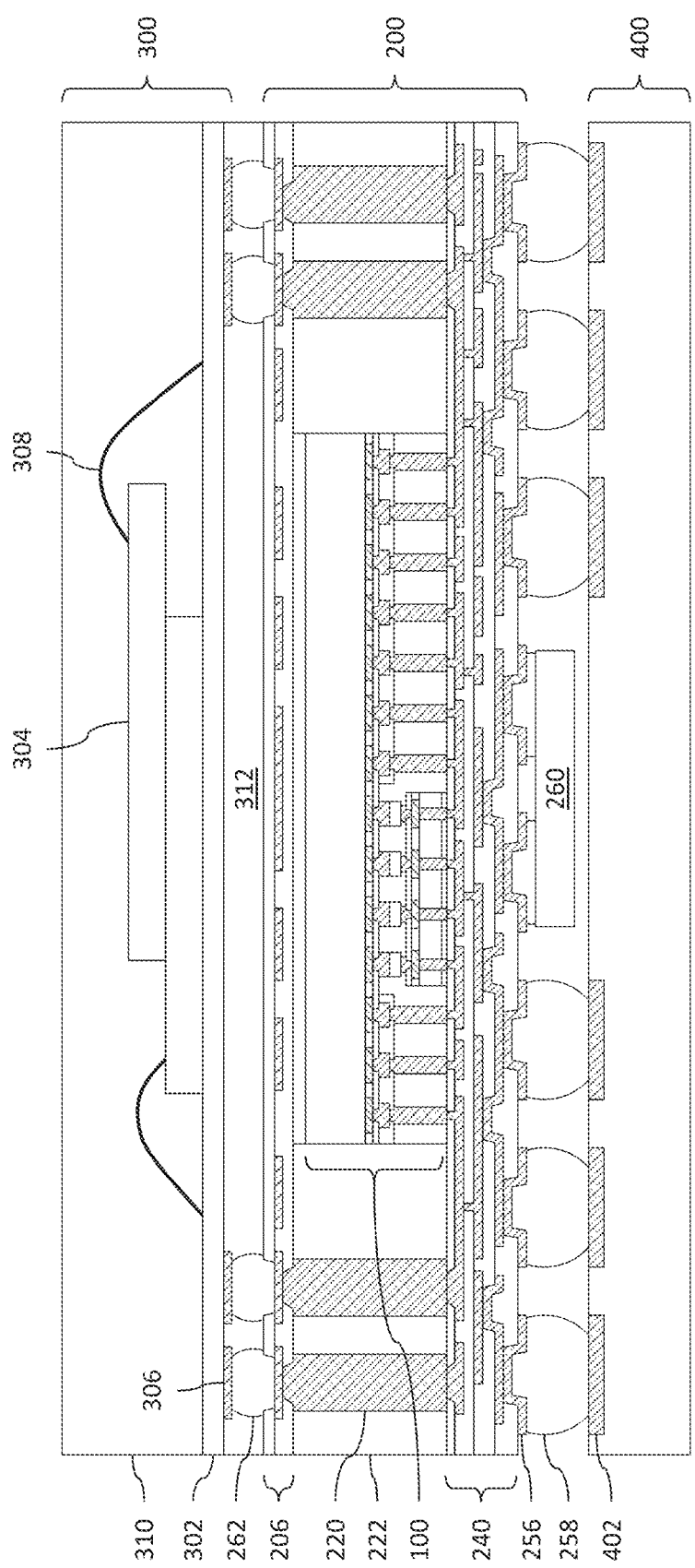
FIG. 18B is a cross-sectional view of an integrated circuit package implementing a die stack, in accordance with some other embodiments.

FIG. 18B is a cross-sectional view of an integrated circuit package implementing the die stack 100, in accordance with some other embodiments. In this embodiment, the underfill 162 (see FIG. 5) is omitted from the die stack 100. As noted above with respect to FIGS. 5 and 6, when the underfill 162 is omitted, the encapsulant 164 can surround and physically contact sidewalls of each of the die connectors 122B, the die connectors 152, and the reflowable connectors 160. Further, when the underfill 162 is omitted, the encapsulant 164 can extend through the dielectric layer 130.

FIGS. 19, 20, 21, and 22 are cross-sectional views of intermediate steps during a process for forming a die stack 500, in accordance with some other embodiments. In this embodiment, the integrated circuit dies of the die stack 500 lack TSVs, which allows thicker integrated circuit dies to be used than the embodiments discussed with respect to FIGS. 1 through 18B. Thus, other types of thick devices, such as IPDs, may also be included in the die stack 500. The integrated circuit dies of the die stack 500 are directly bonded in a face-to-face manner with reflowable connectors. Stacking of integrated circuit dies in one device region 102A of the wafer 102 is illustrated, but it should be appreciated that the wafer 102 may have any number of device regions, and integrated circuit dies may be stacked to form a die stack in each device region.

Figure 19:
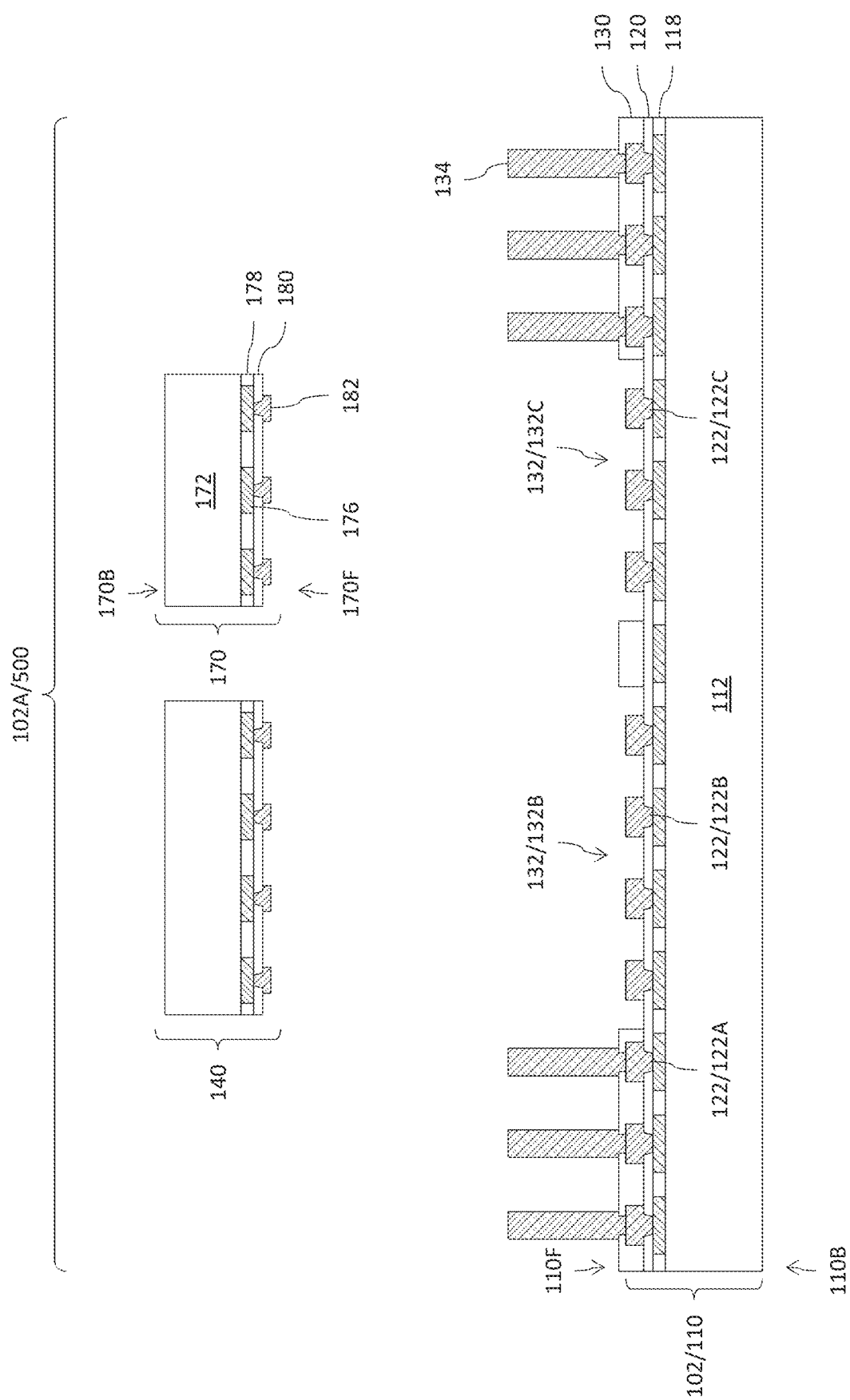
FIGS. 19, 20, 21, and 22 are cross-sectional views of intermediate steps during a process for forming a die stack, in accordance with some other embodiments.

In FIG. 19, an intermediate structure similar to that discussed with respect to FIG. 3 is formed or obtained, except the dielectric layer 130 is further patterned with an opening 132C. As discussed further below, a passive device will be placed in the opening 132C. The opening 132C exposes a third subset of the die connectors 122C, to which the passive device will be bonded.

A second integrated circuit die 140 similar to that discussed with respect to FIG. 4 is formed or obtained. In this embodiment, the second integrated circuit die 140 lacks conductive vias 154 (see FIG. 4). As such, the second integrated circuit die 140 may be formed to a greater thickness without substantially increased manufacturing costs. The overall thickness of the die stack 500 may thus be increased, allowing the die stack 500 to accommodate other types of thick devices, such as passive devices.

A passive device 170 is formed or obtained. The passive device 170 can be an IPD, such as a 2-terminal integrated passive device (IPD), a multi-terminal IPD, or another type of passive device. The passive device 170 may be formed in a wafer, which may include different device regions that are singulated in subsequent steps to form a plurality of integrated circuit dies. The passive device 170 is processed according to applicable manufacturing processes to form passive electrical components. For example, the passive device 170 includes a main structure 172 and one or more passive devices in the main structure 172. The main structure 172 can be, e.g., a semiconductor substrate, an encapsulant, or the like. The passive devices may include capacitors, resistors, inductors, the like, or a combination thereof, which can be formed in and/or on the main structure 172. The passive device 170 can also include contact pads 176, a dielectric layer 178, one or more passivation layer(s) 180, and die connectors 182 which, respectively, can be similar to the contact pads 116, the dielectric layer 118, the passivation layer(s) 120, and the die connectors 122 of the first integrated circuit die 110. The die connectors 182 are exposed at a front side 170F of the passive device 170. The main structure 172, the dielectric layer 178, and the passivation layer(s) 180 are laterally coterminous after singulation of the passive device 170.

Figure 20:
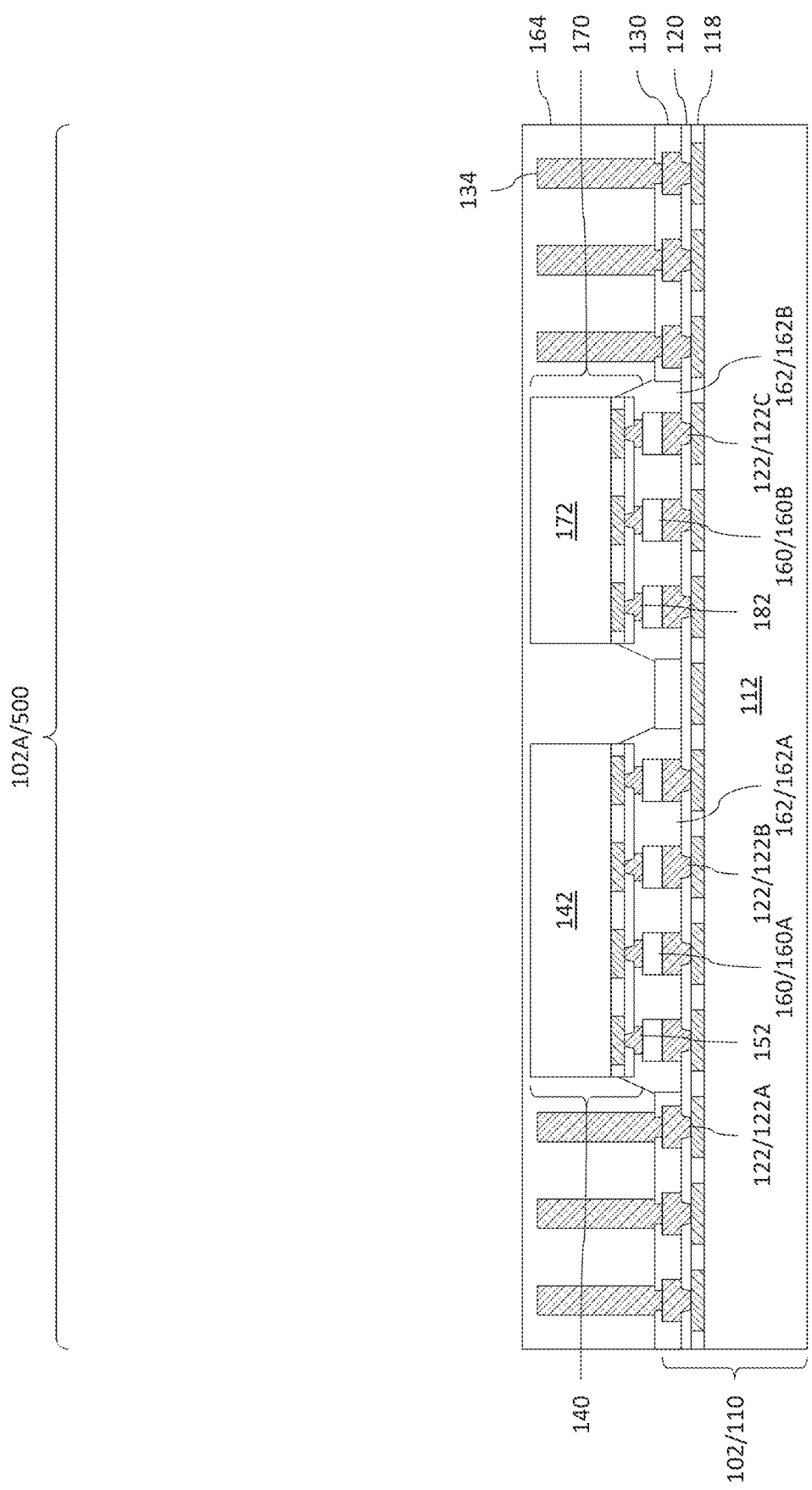

In FIG. 20, the second integrated circuit die 140 is placed in the opening 132B and bonded to the first integrated circuit die 110 (e.g., the wafer 102), and the passive device 170 is placed in the opening 132C and bonded to the first integrated circuit die 110 (e.g., the wafer 102). The bonding may be similar to that discussed with respect to FIG. 5. Specifically, the first integrated circuit die 110 and the second integrated circuit die 140 are directly bonded in a face-to-face manner with a first subset of the reflowable connectors 160A, such that the front side 110F of the first integrated circuit die 110 is bonded to the front side 140F of the second integrated circuit die 140. The first integrated circuit die 110 and the second integrated circuit die 140 are bonded by contacting the reflowable connectors 160A to the die connectors 122B and the die connectors 152, and reflowing the reflowable connectors 160A. Likewise, the first integrated circuit die 110 and the passive device 170 are also directly bonded in a face-to-face manner with a second subset of the reflowable connectors 160B, such that the front side 110F of the first integrated circuit die 110 is bonded to the front side 170F of the passive device 170. The first integrated circuit die 110 and the passive device 170 are bonded by contacting the reflowable connectors 160B to the die connectors 122C and the die connectors 182, and reflowing the reflowable connectors 160B. Bonding the first integrated circuit die 110, the second integrated circuit die 140, and the passive device 170 with the reflowable connectors 160 allows the bonding to be performed at a lower cost than other bonding techniques, such as hybrid bonding. In some embodiments, the second integrated circuit die 140 and the passive device 170 are simultaneously bonded to the first integrated circuit die 110, such as by reflowing the reflowable connectors 160A, 160B with a same reflowing process.

Underfills 162 are optionally formed between the first integrated circuit die 110 and each of the second integrated circuit die 140 and the passive device 170, surrounding the reflowable connectors 160A, 160B. Specifically, a first underfill 162A is formed between the first integrated circuit die 110 and the second integrated circuit die 140, and a second underfill 162B is formed between the first integrated circuit die 110 and the passive device 170. The underfills 162A, 162B can be formed in a similar manner as those discussed with respect to FIG. 5.

An encapsulant 164 is then formed on and around the conductive vias 134, the second integrated circuit die 140, and the passive device 170. The encapsulant 164 can be formed in a similar manner as that discussed with respect to FIG. 6. The components of the structure are buried or covered after encapsulation.

Figure 21:
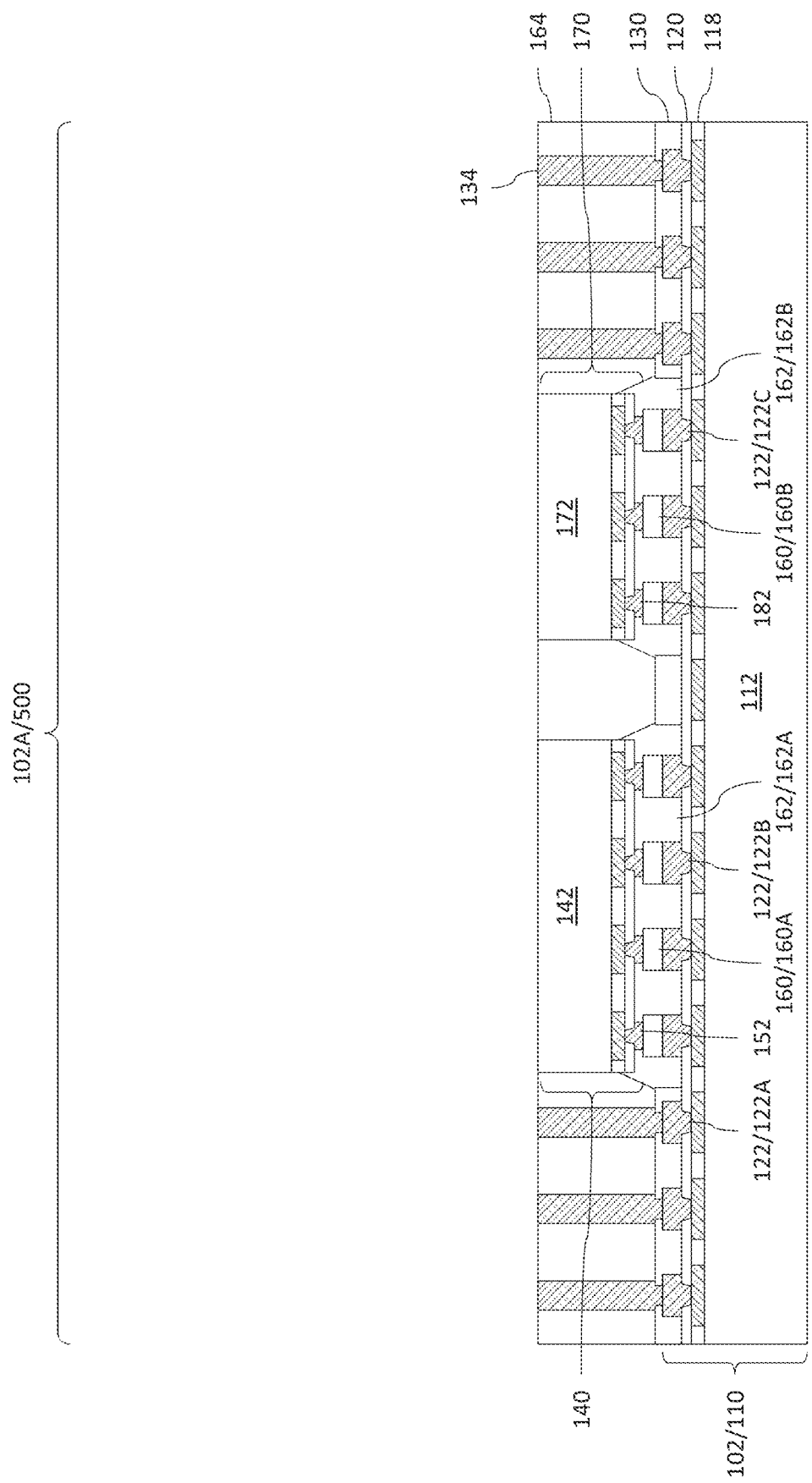

In FIG. 21, a planarization process is performed on the encapsulant 164 to expose the conductive vias 134, the back side 140B of the second integrated circuit die 140, and the back side 170B of the passive device 170. The planarization process can be similar to that discussed with respect to FIG. 7.

In some embodiments, the planarization process includes thinning the semiconductor substrate 142 and main structure 172. The thinning process may be, for example, a chemical-mechanical polish (CMP), a grinding process, an etch-back process, or the like. After the planarization process, the encapsulant 164 and the dielectric layer 130 can have a combined thickness, for example, in the range of about 70 µm to about 180 µm, such as about 100 µm.

Optionally, the semiconductor substrate 112 can be thinned, which can help reduce the overall thickness of the die stack 500. The thinning process may be, for example, a chemical-mechanical polish (CMP), a grinding process, an etch-back process, or the like, which is performed at the back side 110B of the first integrated circuit die 110. After the thinning process, the semiconductor substrate 112 can have a thickness, for example, in the range of about 100 µm to about 150 µm, such as about 130 µm.

Figure 22:
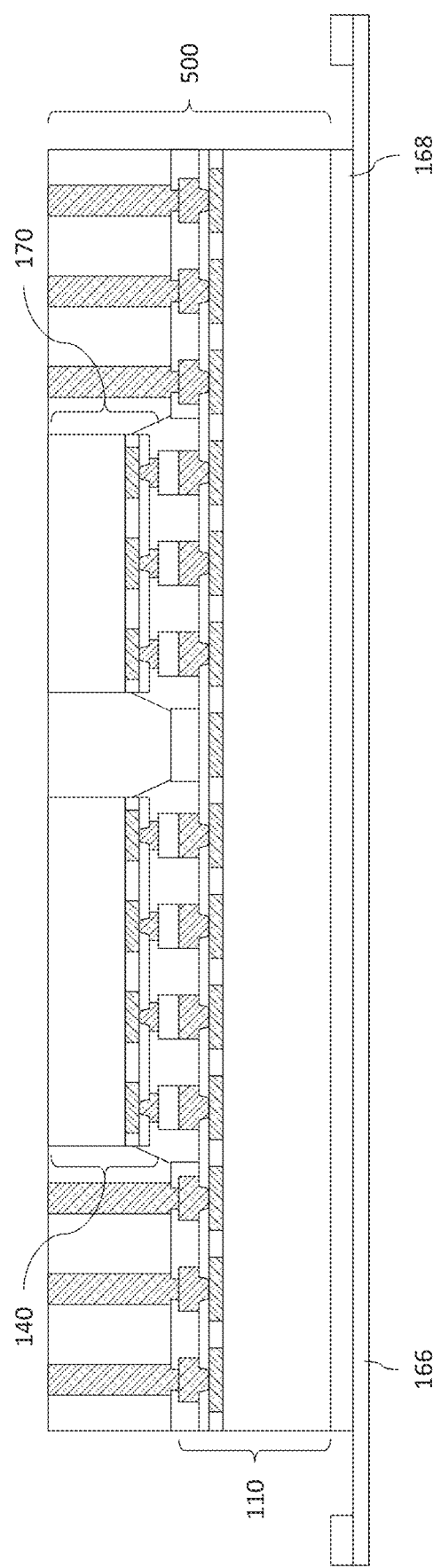

In FIG. 22, a singulation process is performed by sawing along scribe line regions, e.g., around the device region 102A. The singulation process can be similar to that discussed with respect to FIG. 8. The singulation process separates the device region 102A (comprising the first integrated circuit die 110) from adjacent device regions (not illustrated) of the wafer 102 to form the die stack 500. The singulated die stack 500 can then be placed on, e.g., a tape 166. An adhesive 168 is optionally formed on the back side 110B of the first integrated circuit die 110. The adhesive 168 can be formed in a similar manner as that discussed with respect to FIG. 8.

Figure 23A:
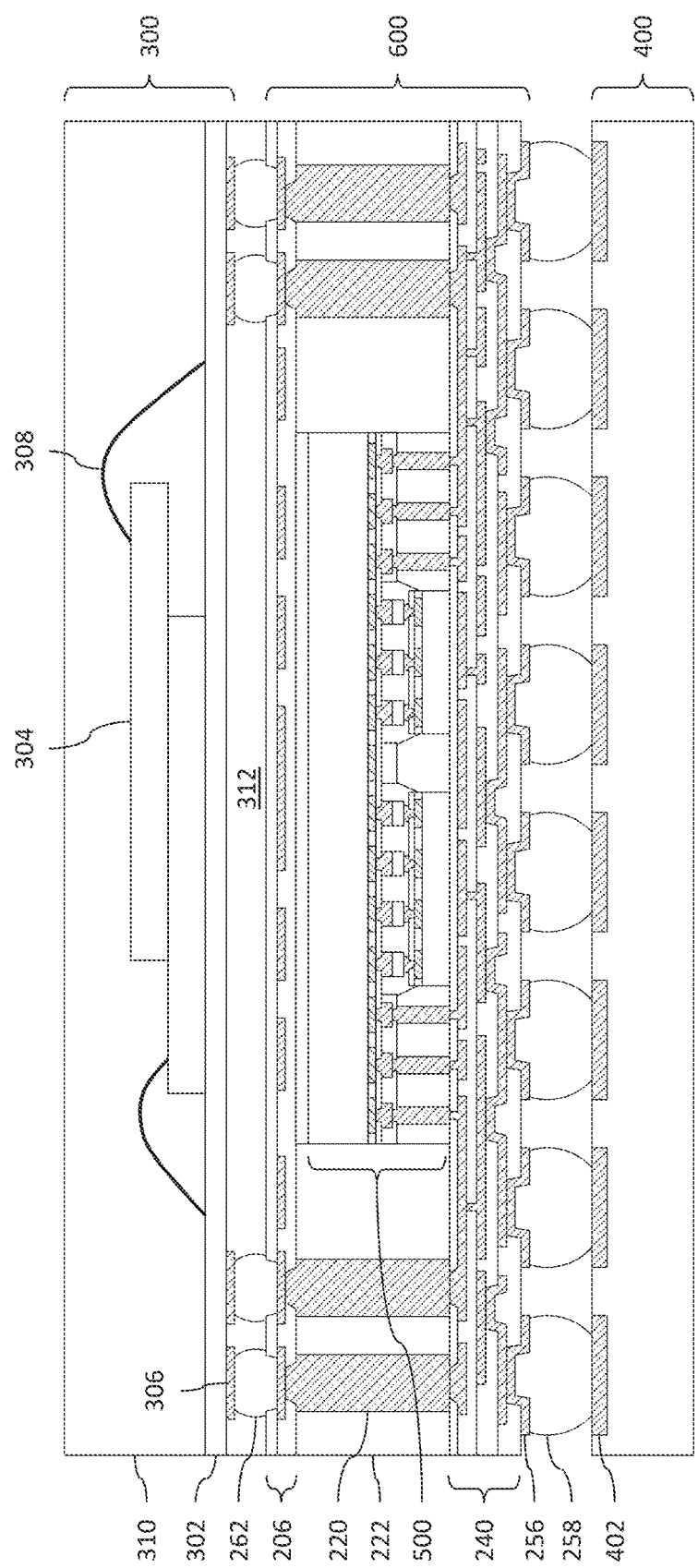
FIG. 23A is a cross-sectional view of an integrated circuit package implementing a die stack, in accordance with some other embodiments.

FIG. 23A is a cross-sectional view of an integrated circuit package implementing the die stack 500, in accordance with some other embodiments. The die stack 500 can be packaged in an integrated circuit package 600, using a process similar to that discussed with respect to FIGS. 9-17. The integrated circuit package 600 may be a fan-out package, such as an integrated fan-out (InFO) package. Another integrated circuit package 300 can be attached to the integrated circuit package 600 using conductive connectors 262 to form a package-on-package structure. The integrated circuit package 300 can be similar to that discussed with respect to FIG. 18A. The integrated circuit package 600 is then attached to a package substrate 400 using conductive connectors 258 to form a completed system. The package substrate 400 can be similar to that discussed with respect to FIG. 18A.

As noted above, the die stack 500 includes passive devices, such as the passive device 170 (see FIG. 22). As such, in this embodiment, the IPDs 260 (see FIG. 18A) can be omitted. Thus, the integrated circuit package 600 may not have passive devices, such as SMDs, mounted to the front-side redistribution structure 240. In another embodiment, the die stack 500 can include passive devices and the integrated circuit package 600 can also include SMDs.

Figure 23B:
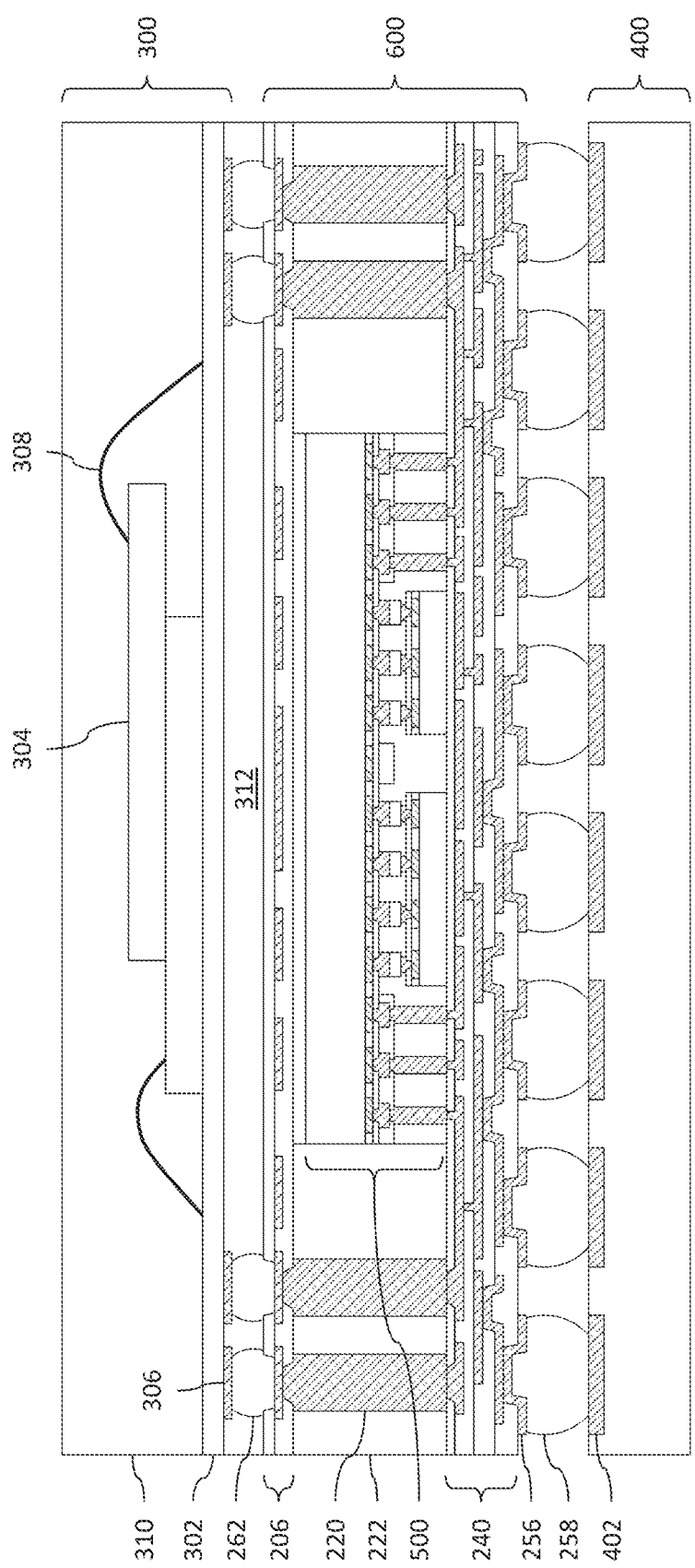
FIG. 23B is a cross-sectional view of an integrated circuit package implementing a die stack, in accordance with some other embodiments.

FIG. 23B is a cross-sectional view of an integrated circuit package implementing the die stack 500, in accordance with some other embodiments. In this embodiment, the underfill 162 (see FIG. 5) is omitted from the die stack 500. As noted above with respect to FIGS. 5 and 6, when the underfill 162 is omitted, the encapsulant 164 can surround and physically contact sidewalls of each of the die connectors 122B, the die connectors 122C, the die connectors 152, the die connectors 182, and the reflowable connectors 160. Further, when the underfill 162 is omitted, the encapsulant 164 can extend through the dielectric layer 130.

FIGS. 24, 25, 26, 27, 28, and 29 are cross-sectional views of intermediate steps during a process for forming a die stack 700, in accordance with some other embodiments. In this embodiment, the integrated circuit dies of the die stack 700 are directly bonded in a back-to-face manner, without using reflowable connectors. Stacking of integrated circuit dies in one device region 102A of the wafer 102 is illustrated, but it should be appreciated that the wafer 102 may have any number of device regions, and integrated circuit dies may be stacked to form a die stack in each device region.

Figure 24:
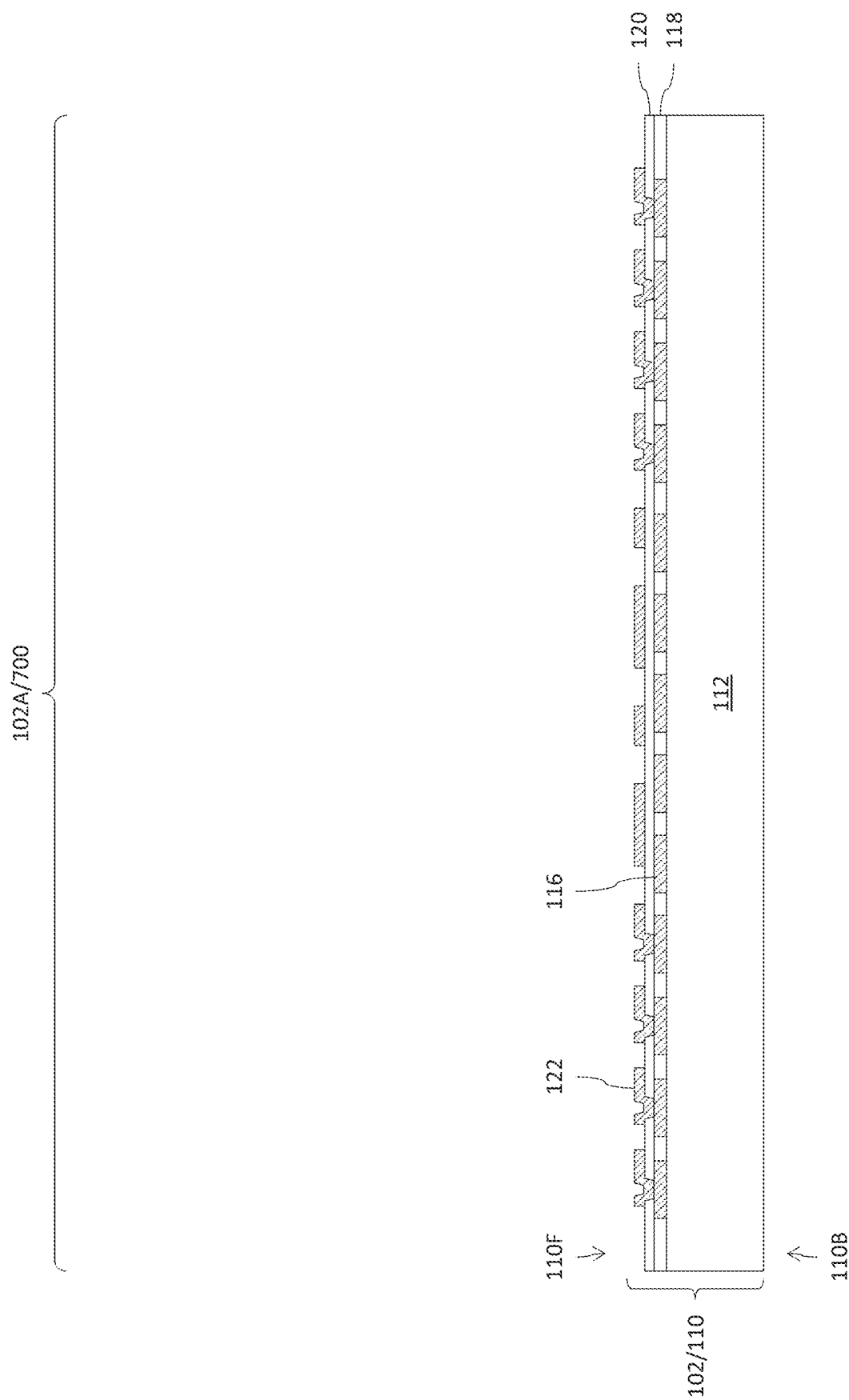
FIGS. 24, 25, 26, 27, 28, and 29 are cross-sectional views of intermediate steps during a process for forming a die stack, in accordance with some other embodiments.

In FIG. 24, a wafer 102 is formed or obtained. The wafer 102 is similar to that discussed with respect to FIG. 1, except the die connectors 122 are post passivation interconnects (PPIs). Thus, the die connectors 122 include first portions extending through the passivation layer(s) 120, and also include second portions extending along the passivation layer(s) 120. As discussed further below, using die connectors that are PPIs allows more conductive vias 134 to be formed in the die stack 700.

Figure 25:
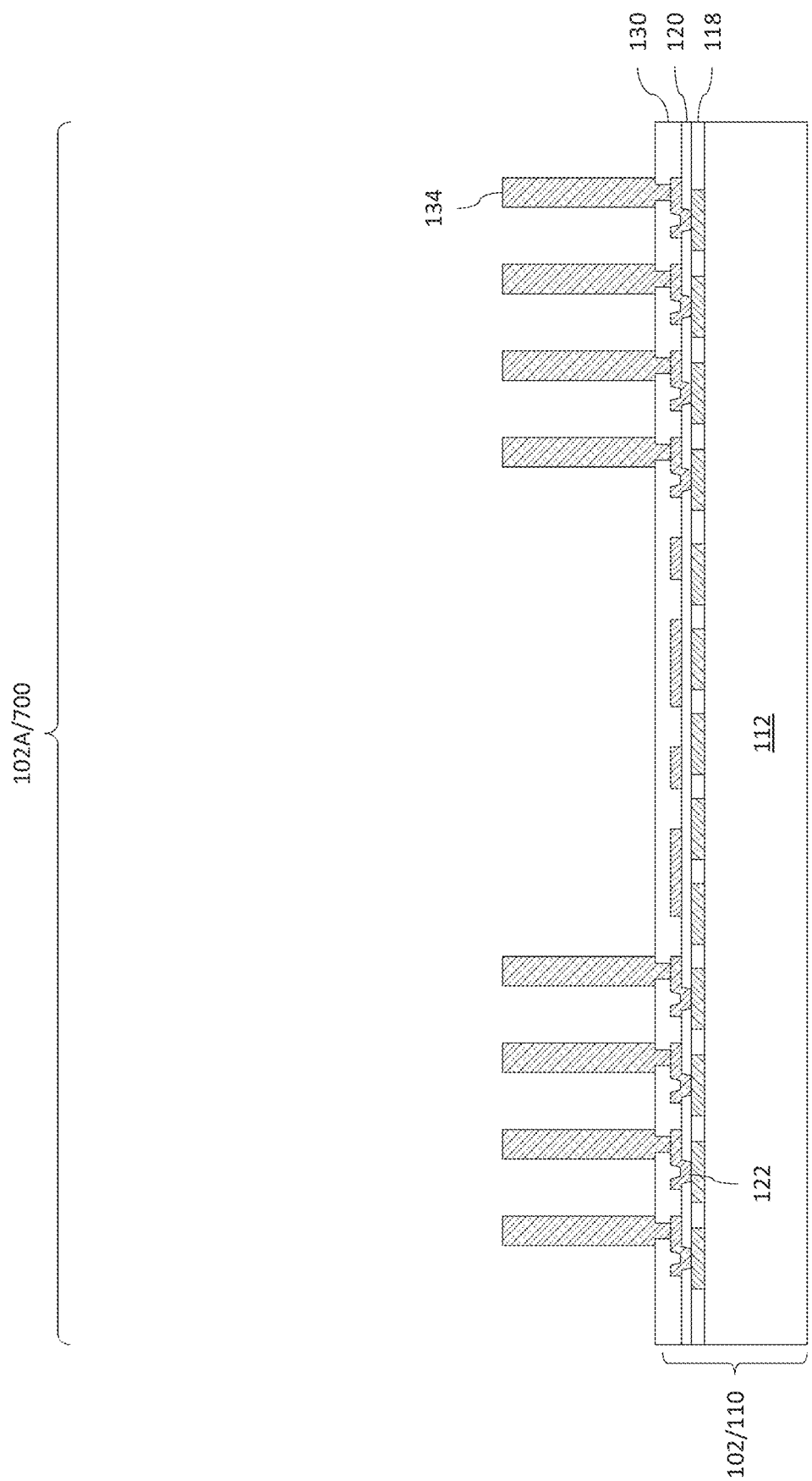

In FIG. 25, a dielectric layer 130 is formed on the wafer 102, such as on the die connectors 122 and passivation layer(s) 120. The dielectric layer 130 can be formed in a similar manner as that discussed with respect to FIG. 2. Conductive vias 134 are then formed through the dielectric layer 130, extending away from the wafer 102. The conductive vias 134 can be formed in a similar manner as those discussed with respect to FIG. 3. Because the die connectors 122 are PPIs, they may help redistribute stress induced by the conductive vias 134 across the area of the die stack 700. More conductive vias 134 may thus be formed in the die stack 700 than in the embodiments discussed with respect to FIGS. 3 and 19. When more conductive vias 134 are formed, they can have a finer pitch than the conductive vias 134 discussed with respect to FIGS. 3 and 19. For example, the conductive vias 134 can be formed to a pitch in the range of about 40 μm to about 80 μm.

Figure 26:
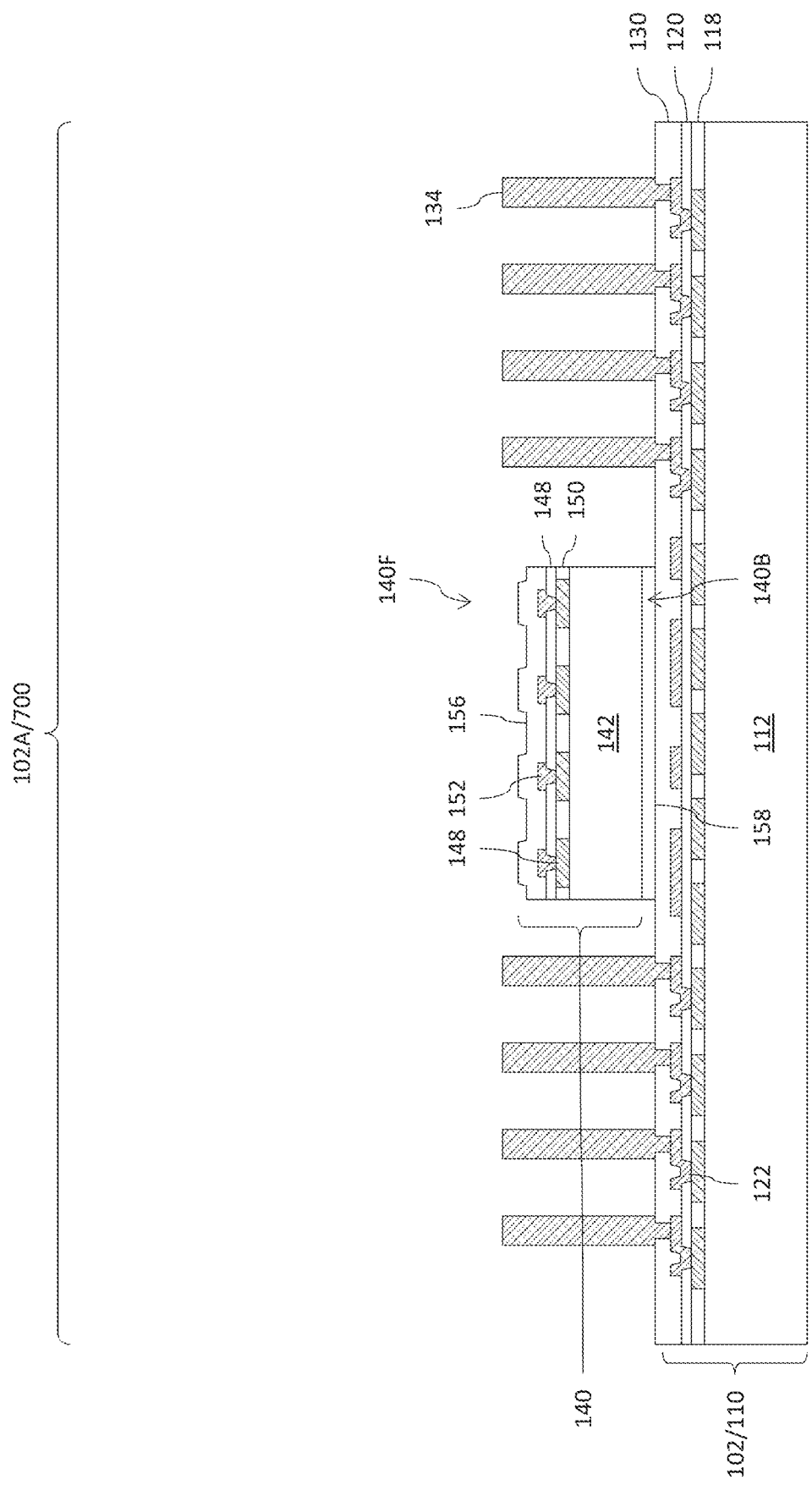

In FIG. 26, a second integrated circuit die 140 is formed or obtained. The second integrated circuit die 140 is similar to that discussed with respect to FIG. 4, except the second integrated circuit die 140 lacks conductive vias 154 (see FIG. 4), and the second integrated circuit die 140 includes another dielectric layer 156 at the front side 140F, covering the die connectors 152. The back side 140B of the second integrated circuit die 140 is placed on the dielectric layer 130, among the conductive vias 134, and is bonded to the dielectric layer 130 with the adhesive 158. The adhesive 158 is formed on the back side 140B of the second integrated circuit die 140. The adhesive 158 may be any suitable adhesive, epoxy, die attach film (DAF), or the like. In the embodiment shown, the adhesive 158 is applied to the back side 140B of the second integrated circuit die 140 before singulating to separate the second integrated circuit die 140.

The first integrated circuit die 110 and the second integrated circuit die 140 are directly bonded in a back-to-face manner with the adhesive 158. Such bonding may be performed at a lower cost than other bonding techniques, such as hybrid bonding. Due to the orientations of the dies, the conductive vias 134 will be used to electrically couple the first integrated circuit die 110 and the second integrated circuit die 140. The die stack 700 may thus need more conductive vias 134 than the die stack 100 (see FIG. 8) or the die stack 500 (see FIG. 22) to accommodate the I/O connectors of the first integrated circuit die 110. As noted above, because the die connectors 122 are PPIs, more conductive vias 134 can be formed in the die stack 700 and back-to-face bonding can be accomplished.

Figure 27:
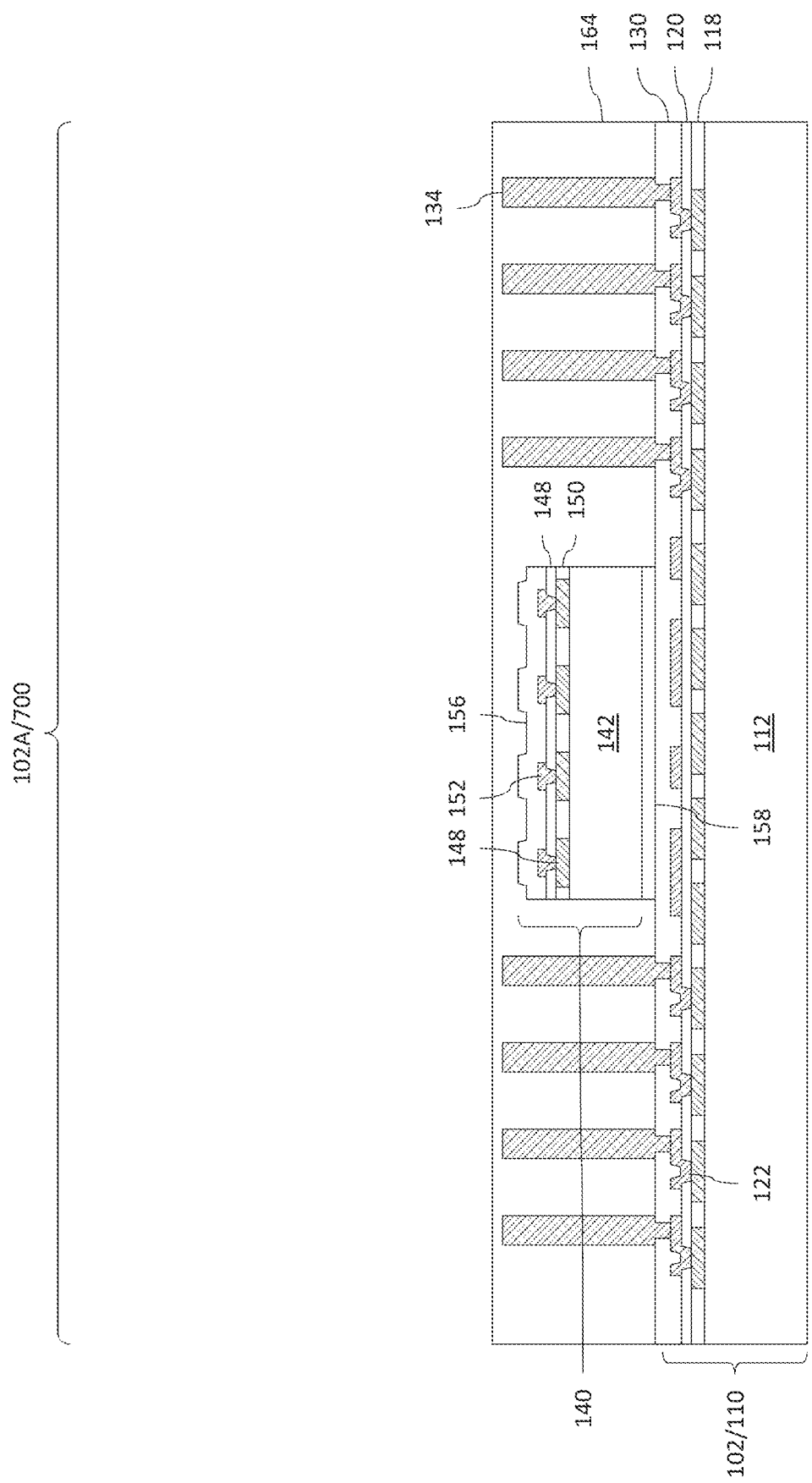

In FIG. 27, an encapsulant 164 is formed on and around the conductive vias 134 and the second integrated circuit die 140. The encapsulant 164 can be formed in a similar manner as that discussed with respect to FIG. 6.

Figure 28:
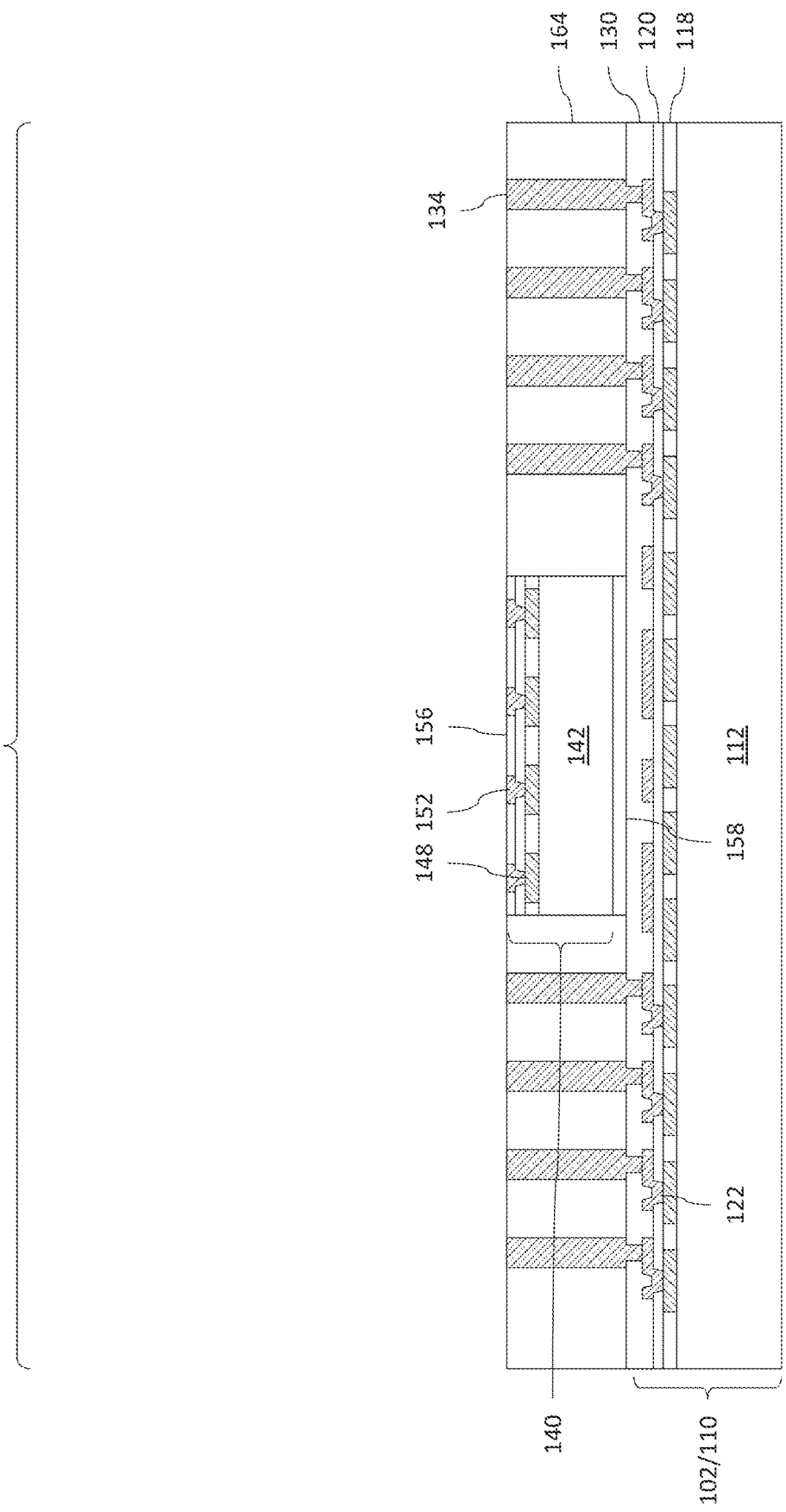

In FIG. 28, a planarization process is performed on the encapsulant 164 and dielectric layer 156 to expose the conductive vias 134 and the die connectors 152 of the second integrated circuit die 140. The planarization process can be similar to that discussed with respect to FIG. 7. After the planarization process, remaining portions of the dielectric layer 156 surround the die connectors 152.

Optionally, the semiconductor substrate 112 can be thinned, which can help reduce the overall thickness of the die stack 500. The thinning process may be, for example, a chemical-mechanical polish (CMP), a grinding process, an etch-back process, or the like, which is performed at the back side 110B of the first integrated circuit die 110. After the thinning process, the semiconductor substrate 112 can have a thickness, for example, in the range of about 50 μm to about 90 μm, such as about 70 μm.

Figure 29:
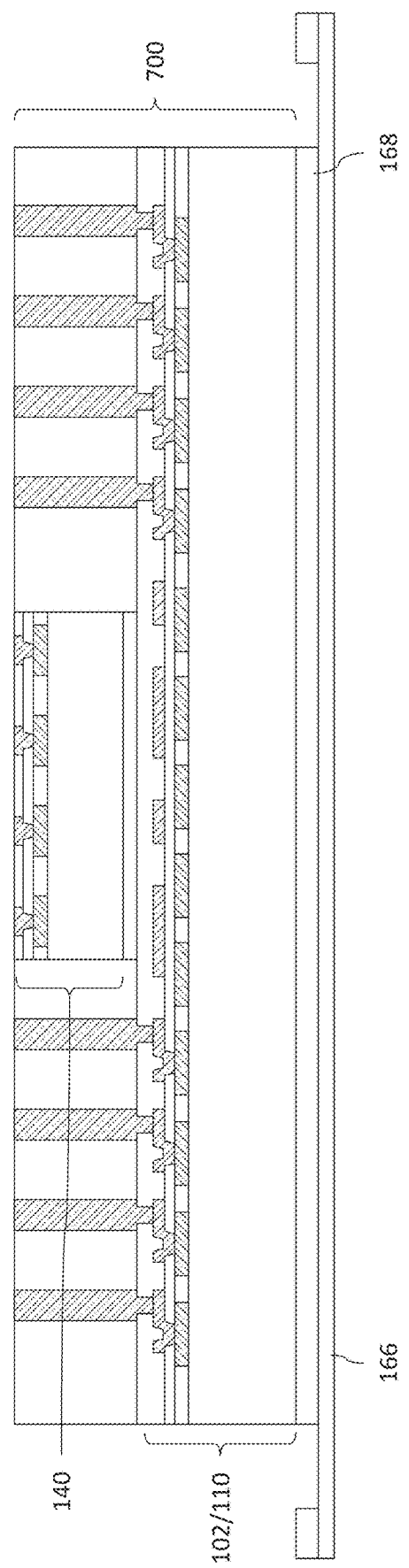

In FIG. 29, a singulation process is performed by sawing along scribe line regions, e.g., around the device region 102A. The singulation process can be similar to that discussed with respect to FIG. 8. The singulation process separates the device region 102A (comprising the first integrated circuit die 110) from adjacent device regions (not illustrated) of the wafer 102 to form the die stack 700. The singulated die stack 700 can then be placed on, e.g., a tape 166. An adhesive 168 is optionally formed on the back side 110B of the first integrated circuit die 110. The adhesive 168 can be formed in a similar manner as that discussed with respect to FIG. 8.

Figure 30:
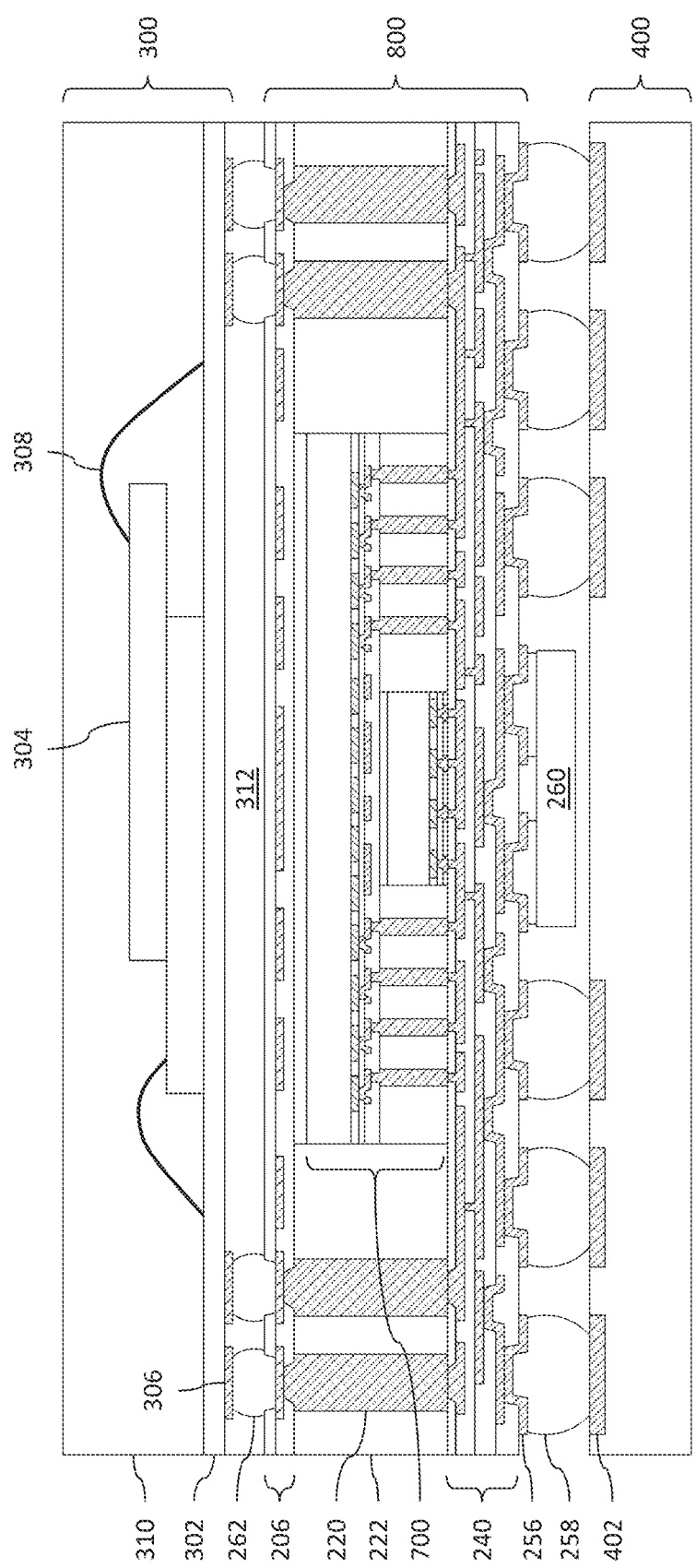
FIG. 30 is a cross-sectional view of an integrated circuit package implementing a die stack, in accordance with some other embodiments.

FIG. 30 is a cross-sectional view of an integrated circuit package implementing the die stack 700, in accordance with some other embodiments. The die stack 700 can be packaged in an integrated circuit package 800, using a process similar to that discussed with respect to FIGS. 9-17. The integrated circuit package 800 may be a fan-out package, such as an integrated fan-out (InFO) package. The metallization patterns of the front-side redistribution structure 240 electrically couple the first integrated circuit die 110 and the second integrated circuit die 140. In some embodiments, the die stack 700 lacks passive devices. In such embodiments, IPDs 260 can be connected to the UBMs 256. The IPDs 260 can be similar to those discussed with respect to FIG. 16. Another integrated circuit package 300 can be attached to the integrated circuit package 800 using conductive connectors 262 to form a package-on-package structure. The integrated circuit package 300 can be similar to that discussed with respect to FIG. 18A. The integrated circuit package 800 is then attached to a package substrate 400 using conductive connectors 258 to form a completed system. The package substrate 400 can be similar to that discussed with respect to FIG. 18A.

Embodiments may achieve advantages. Forming the die stacks 100, 500, 700 by bonding the integrated circuit dies 110, 140 with reflowable connectors or adhesives may allow the bonding to be performed at a lower cost than other bonding techniques, such as hybrid bonding. Forming the die stacks 100, 500, 700 at a lower cost may be particularly desirable when the die stack is a low-performance device. Further, although hybrid bonding may allow the die stacks 100, 500, 700 to have a finer die connector pitch or a larger input/output (I/O) connector count, such features may be unnecessary when the die stack is a low-performance device. Some embodiments may also allow passive devices to be included in an integrated circuit package in a low-cost manner.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In an embodiment, a structure includes: a first integrated circuit die including first die connectors; a first dielectric layer on the first die connectors; first conductive vias extending through the first dielectric layer, the first conductive vias connected to a first subset of the first die connectors; a second integrated circuit die bonded to a second subset of the first die connectors with first reflowable connectors; a first encapsulant surrounding the second integrated circuit die and the first conductive vias, the first encapsulant and the first integrated circuit die being laterally coterminous; second conductive vias adjacent the first integrated circuit die; a second encapsulant surrounding the second conductive vias, the first encapsulant, and the first integrated circuit die; and a first redistribution structure including first redistribution lines, the first redistribution lines connected to the first conductive vias and the second conductive vias.

In some embodiments, the structure further includes: an underfill surrounding each of the first reflowable connectors and the second subset of the first die connectors, the underfill extending through the first dielectric layer. In some embodiments of the structure, the first encapsulant has a first portion surrounding each of the first reflow able connectors and the second subset of the first die connectors, the first portion of the first encapsulant extending through the first dielectric layer. In some embodiments of the structure, the second integrated circuit die includes: through-substrate vias (TSVs), the first redistribution lines of the first redistribution structure connected to the TSVs; and a barrier layer surrounding the TSVs, the barrier layer contacting a second dielectric layer of the first redistribution structure. In some embodiments of the structure, the second integrated circuit die lacks TSVs, and the structure further includes: a passive device bonded to a third subset of the first die connectors with second reflowable connectors, the first encapsulant surrounding the passive device. In some embodiments of the structure, the first encapsulant includes a first molding material, the second encapsulant includes a second molding material, and the first molding material is different from the second molding material. In some embodiments of the structure, the first molding material comprises fillers of a smaller size than the second molding material. In some embodiments, the structure further includes: a second redistribution structure including second redistribution lines, the second redistribution lines connected to the second conductive vias; a memory device connected to the second redistribution lines of the second redistribution structure; and a package substrate connected to the first redistribution lines of the first redistribution structure. In some embodiments, the structure further includes: a surface-mount passive device connected to the first redistribution lines of the first redistribution structure.

In an embodiment, a structure includes: a first integrated circuit die including post passivation interconnects (PPIs); a dielectric layer on the PPIs; first conductive vias extending through the dielectric layer, the first conductive vias connected to the PPIs; a second integrated circuit die including a semiconductor substrate and die connectors, the semiconductor substrate bonded to the dielectric layer with an adhesive; a first encapsulant surrounding the second integrated circuit die and the first conductive vias, the first encapsulant and the first integrated circuit die being laterally coterminous; second conductive vias adjacent the first integrated circuit die; a second encapsulant surrounding the second conductive vias, the first encapsulant, and the first integrated circuit die; and a first redistribution structure including first redistribution lines, the first redistribution lines connected to the first conductive vias, the die connectors, and the second conductive vias.

In some embodiments of the structure, the first encapsulant includes a first molding material, the second encapsulant includes a second molding material, and the first molding material is different from the second molding material. In some embodiments of the structure, the first molding material comprises fillers of a smaller size than the second molding material. In some embodiments, the structure further includes: a second redistribution structure including second redistribution lines, the second redistribution lines connected to the second conductive vias; a memory device connected to the second redistribution lines of the second redistribution structure; and a package substrate connected to the first redistribution lines of the first redistribution structure. In some embodiments, the structure further includes: a surface-mount passive device connected to the first redistribution lines of the first redistribution structure.

In an embodiment, a method includes: forming first conductive vias on a first integrated circuit die; bonding a second integrated circuit die to the first integrated circuit die with first reflowable connectors, the second integrated circuit die adjacent the first conductive vias; encapsulating the first conductive vias and the second integrated circuit die with a first molding compound; singulating the first molding compound and the first integrated circuit die to form a die stack; placing the die stack adjacent second conductive vias; encapsulating the second conductive vias and the die stack with a second molding compound; and forming a first redistribution structure on the second molding compound and the die stack, the first redistribution structure including first redistribution lines, the first redistribution lines connected to the first conductive vias and the second conductive vias.

In some embodiments of the method, the first integrated circuit die includes first die connectors, the second integrated circuit die includes second die connectors, and the bonding the second integrated circuit die to the first integrated circuit die includes: depositing a dielectric layer on the first integrated circuit die; patterning the dielectric layer with a first opening, the first opening exposing a first subset of the first die connectors; placing the second integrated circuit die in the first opening; and connecting the second die connectors to the first subset of the first die connectors with the first reflowable connectors. In some embodiments, the method further includes: patterning the dielectric layer with a second opening, the second opening exposing a second subset of the first die connectors; placing a passive device in the second opening, the passive device including third die connectors; and connecting the third die connectors to the second subset of the first die connectors with second reflowable connectors. In some embodiments of the method, the second integrated circuit die includes a semiconductor substrate and through-substrate vias (TSVs) extending through the semiconductor substrate, and further including: after encapsulating the second conductive vias and the die stack with the second molding compound, planarizing the second molding compound, where the first conductive vias, the second conductive vias, and the TSVs are exposed after the planarizing. In some embodiments of the method, the planarizing includes: thinning the second molding compound with a first grinding process to expose the semiconductor substrate; thinning the semiconductor substrate with a second grinding process, the second grinding process having a lesser removal rate than the first grinding process; and thinning the semiconductor substrate with a third grinding process to expose the TSVs, the third grinding process having a lesser removal rate than the second grinding process. In some embodiments, the method further includes: after the third grinding process, recessing the semiconductor substrate to expose sidewall portions of the TSVs; and depositing a barrier layer around the sidewall portions of the TSVs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming first conductive vias on a first integrated circuit die;
   bonding a second integrated circuit die to the first integrated circuit die with first reflowable connectors, the second integrated circuit die adjacent the first conductive vias;
   encapsulating the first conductive vias and the second integrated circuit die with a first molding compound;
   singulating the first molding compound and the first integrated circuit die to form a die stack;
   placing the die stack adjacent second conductive vias;
   encapsulating the second conductive vias and the die stack with a second molding compound; and
   forming a first redistribution structure on the second molding compound and the die stack, the first redistribution structure comprising first redistribution lines, the first redistribution lines connected to the first conductive vias and the second conductive vias.

2. The method of claim 1, wherein the first integrated circuit die comprises first die connectors, the second integrated circuit die comprises second die connectors, and the bonding the second integrated circuit die to the first integrated circuit die comprises:
   depositing a dielectric layer on the first integrated circuit die;
   patterning the dielectric layer with a first opening, the first opening exposing a first subset of the first die connectors;
   placing the second integrated circuit die in the first opening; and
   connecting the second die connectors to the first subset of the first die connectors with the first reflowable connectors.

3. The method of claim 2 further comprising:
   patterning the dielectric layer with a second opening, the second opening exposing a second subset of the first die connectors;
   placing a passive device in the second opening, the passive device comprising third die connectors; and
   connecting the third die connectors to the second subset of the first die connectors with second reflowable connectors.

4. The method of claim 1, wherein the second integrated circuit die comprises a semiconductor substrate and through-substrate vias (TSVs) extending through the semiconductor substrate, and further comprising:
   after encapsulating the second conductive vias and the die stack with the second molding compound, planarizing the second molding compound, wherein the first conductive vias, the second conductive vias, and the TSVs are exposed after the planarizing.

5. The method of claim 4, wherein the planarizing comprises:
   thinning the second molding compound with a first grinding process to expose the semiconductor substrate;
   thinning the semiconductor substrate with a second grinding process, the second grinding process having a lesser removal rate than the first grinding process; and
   thinning the semiconductor substrate with a third grinding process to expose the TSVs, the third grinding process having a lesser removal rate than the second grinding process.

6. The method of claim 5 further comprising:
   after the third grinding process, recessing the semiconductor substrate to expose sidewall portions of the TSVs; and
   depositing a barrier layer around the sidewall portions of the TSVs.

7. The method of claim 1, wherein the first molding compound is different from the second molding compound.

8. The method of claim 7, wherein the first molding compound comprises fillers of a smaller size than the second molding compound.

9. The method of claim 1 further comprising, before singulating the first molding compound and the first integrated circuit die:
   forming an underfill between the first integrated circuit die and the second integrated circuit die, the underfill surrounding each of the first reflowable connectors.

10. The method of claim 1, wherein the first molding compound has a portion between the first integrated circuit die and the second integrated circuit die, the portion of the first molding compound surrounding each of the first reflowable connectors.

11. A method comprising:
depositing a dielectric layer on a first integrated circuit die, the first integrated circuit die comprising first die connectors;
patterning the dielectric layer with first openings and a second opening, the first openings exposing a first subset of the first die connectors, the second opening exposing a second subset of the first die connectors;
plating conductive vias in the first openings, the conductive vias connected to the first subset of the first die connectors;
placing a second integrated circuit die in the second opening, the second integrated circuit die comprising second die connectors;
bonding the second die connectors to the second subset of the first die connectors with reflowable connectors;
encapsulating the conductive vias and the second integrated circuit die with a first molding compound; and
singulating the first molding compound and the first integrated circuit die to form a die stack.

12. The method of claim 11 further comprising:
forming an underfill in the second opening, the underfill surrounding the reflowable connectors.

13. The method of claim 11, wherein a portion of the first molding compound is dispensed in the second opening, the portion of the first molding compound surrounding the reflowable connectors.

14. The method of claim 11 further comprising:
encapsulating the die stack with a second molding compound, the second molding compound different from the first molding compound; and
forming a redistribution structure on the second molding compound, the redistribution structure comprising redistribution lines, the redistribution lines connected to the conductive vias.

15. The method of claim 14, wherein the first molding compound comprises fillers of a smaller size than the second molding compound.

16. The method of claim 14, wherein the second integrated circuit die comprises through-substrate vias (TSVs), the redistribution lines connected to the TSVs, the method further comprising:
exposing the TSVs and the conductive vias through the second molding compound by planarizing the second molding compound.

17. A method comprising:
receiving a die stack comprising:
a first integrated circuit die comprising first die connectors;
a dielectric layer on the first die connectors;
first conductive vias extending through the dielectric layer, the first conductive vias connected to a first subset of the first die connectors;
a second integrated circuit die extending through the dielectric layer, the second integrated circuit die bonded to a second subset of the first die connectors with first reflowable connectors;
a first encapsulant surrounding the second integrated circuit die and the first conductive vias, the first encapsulant and the first integrated circuit die being laterally coterminous;
encapsulating the die stack with a second encapsulant; and
forming a redistribution structure on the second encapsulant, the redistribution structure comprising redistribution lines, the redistribution lines connected to the first conductive vias.

18. The method of claim 17 further comprising:
forming second conductive vias adjacent the die stack, the second encapsulant formed around the second conductive vias, the redistribution lines connected to the second conductive vias.

19. The method of claim 17, wherein the second integrated circuit die comprises through-substrate vias (TSVs), the redistribution lines connected to the TSVs.

20. The method of claim 17, wherein the first encapsulant comprises a first molding material, the second encapsulant comprises a second molding material, and the first molding material comprises fillers of a smaller size than the second molding material.

* * * * *